US012556275B2

(12) United States Patent
Wang et al.

(10) Patent No.: US 12,556,275 B2
(45) Date of Patent: Feb. 17, 2026

(54) DISPLAY SUBSTRATE, DISPLAY APPARATUS, AND VISIBLE LIGHT COMMUNICATION SYSTEM

(71) Applicant: BOE Technology Group Co., Ltd., Beijing (CN)

(72) Inventors: Weijie Wang, Beijing (CN); Zhongyuan Sun, Beijing (CN); Fengjie Zhang, Beijing (CN); Rui Huang, Beijing (CN); Jiabin Wang, Beijing (CN); Yangbing Li, Beijing (CN); Yuzhen Guo, Beijing (CN); Biqi Li, Beijing (CN); Lu Wang, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 578 days.

(21) Appl. No.: 17/921,360

(22) PCT Filed: Oct. 26, 2021

(86) PCT No.: PCT/CN2021/126497
§ 371 (c)(1),
(2) Date: Oct. 26, 2022

(87) PCT Pub. No.: WO2023/070331
PCT Pub. Date: May 4, 2023

(65) Prior Publication Data
US 2024/0356640 A1   Oct. 24, 2024

(51) Int. Cl.
*H04B 10/116*   (2013.01)
*H04B 10/114*   (2013.01)
(Continued)

(52) U.S. Cl.
CPC ....... *H04B 10/116* (2013.01); *H04B 10/1149* (2013.01); *H10K 39/30* (2023.02);
(Continued)

(58) Field of Classification Search
CPC .. H04B 10/116; H04B 10/1149; H10K 39/30; H10K 59/353; H10K 59/60; H10K 65/00; H10K 59/65
See application file for complete search history.

(56) References Cited

U.S. PATENT DOCUMENTS

2009/0295760 A1* 12/2009 Linge .................... G06F 3/0421
                                                            345/179
2011/0043487 A1*  2/2011 Huang ................. G09G 3/3233
                                                            315/32
(Continued)

FOREIGN PATENT DOCUMENTS

CN       104009067 A      8/2014
CN       105206204 A     12/2015
(Continued)

OTHER PUBLICATIONS

Office Action dated Jul. 11, 2025 for CN202180003097.X and English Translation.

*Primary Examiner* — Bitew A Dinke
(74) *Attorney, Agent, or Firm* — Ling Wu; Stephen Yang; Ling and Yang Intellectual Property

(57) ABSTRACT

A display substrate, a display apparatus, and a visible light communication system are disclosed. The display substrate includes an effective display region and a peripheral region surrounding the effective display region, the display substrate includes a base substrate, and a display unit, a light receiving unit, and a light emission unit on the base substrate. The display unit is in the effective display region and includes multiple light emitting sub-pixels; the light receiving unit is in at least one of a first light transceiving region
(Continued)

and a second light transceiving region, the light emission unit is in at least one of a first light transceiving region and a second light transceiving region. The first light transceiving region is in the peripheral region and is an annular region surrounding the effective display region, and the second light transceiving region is between multiple light emitting sub-pixels of the effective display region.

23 Claims, 19 Drawing Sheets

(51) Int. Cl.
H10K 39/30 (2023.01)
H10K 59/35 (2023.01)
H10K 59/60 (2023.01)
H10K 65/00 (2023.01)

(52) U.S. Cl.
CPC ........... *H10K 59/353* (2023.02); *H10K 59/60* (2023.02); *H10K 65/00* (2023.02)

(56) References Cited

U.S. PATENT DOCUMENTS

| | | | |
|---|---|---|---|
| 2018/0253962 | A1 | 9/2018 | Guan et al. |
| 2018/0261655 | A1* | 9/2018 | Lee ................. H10K 59/35 |
| 2018/0277033 | A1 | 9/2018 | Jia et al. |
| 2019/0013368 | A1* | 1/2019 | Chung ................. H10K 59/65 |
| 2019/0065717 | A1* | 2/2019 | Won ................. G06V 40/1318 |
| 2019/0206917 | A1* | 7/2019 | Nakajiki ............. H10F 39/8053 |
| 2019/0363792 | A1 | 11/2019 | Tsonev et al. |
| 2020/0083302 | A1* | 3/2020 | Park ................. H10K 50/828 |
| 2020/0125189 | A1* | 4/2020 | Kim ................. G06F 3/04162 |
| 2021/0297618 | A1* | 9/2021 | Miyoshi ............. H10F 39/802 |
| 2021/0366404 | A1 | 11/2021 | Yang et al. |
| 2022/0028934 | A1* | 1/2022 | Kim ................. H10K 59/352 |
| 2022/0173174 | A1* | 6/2022 | Hatsumi ................. G09G 3/30 |
| 2022/0344405 | A1* | 10/2022 | Zhu ................. H10K 30/80 |
| 2023/0197748 | A1* | 6/2023 | Uesaka ................. H10F 39/807 257/432 |

FOREIGN PATENT DOCUMENTS

| | | | | |
|---|---|---|---|---|
| CN | 105389148 | A | | 3/2016 |
| CN | 205657058 | U | | 10/2016 |
| CN | 107093617 | A | | 8/2017 |
| CN | 107608114 | A | | 1/2018 |
| CN | 108399885 | A | | 8/2018 |
| CN | 108964762 | A | | 12/2018 |
| CN | 110165031 | A | | 8/2019 |
| CN | 110192219 | A | | 8/2019 |
| CN | 110600527 | A | | 12/2019 |
| CN | 111082864 | A | | 4/2020 |
| CN | 111341808 | A * | 6/2020 | ........... H04B 10/116 |
| CN | 111756445 | A | | 10/2020 |
| CN | 112564796 | A | | 3/2021 |

* cited by examiner

DISPLAY SUBSTRATE, DISPLAY APPARATUS, AND VISIBLE LIGHT COMMUNICATION SYSTEM

CROSS-REFERENCE TO RELATED APPLICATION

The present application is a U.S. National Phase Entry of International Application PCT/CN2021/126497 having an international filing date of Oct. 26, 2021, and the contents disclosed in the above-mentioned applications are hereby incorporated as a part of this application.

TECHNICAL FIELD

Embodiments of the present disclosure relate to, but are not limited to, the field of display technologies, in particular to a display substrate, a display apparatus, and a visible light communication system.

BACKGROUND

With development of wireless communication technologies, shortage of limited wireless spectrum resources is becoming more and more severe. Many frequency bands have been occupied, and visible light spectrum resources are abundant (between 375 nm and 780 nm), which do not require authorization. A bandwidth of visible light spectra is more than 10,000 times that of current wireless spectra (electromagnetic wave). Therefore, no spectrum is required for adopting visible light communication, and a transmission rate may reach 50 times (even more) of a current 5G transmission rate, and is 80 to 100 times of a transmission rate of Wireless Fidelity (WiFi). At the same time, the visible light communication may use an existing Light Emitting Diode (LED) lamp as an emission source, does not require expensive equipment such as a base station, and has a relatively low cost and is free from electromagnetic interference.

Visible Light Communication (VLC) technology is a new wireless transmission technology that uses a visible light spectrum (such as light emitted by a bulb) to transmit data. Referring to FIG. 1, a VLC system mainly includes an emission end, a channel, and a receiving end, and a receiving technology is a very important part in visible light communication, which mainly involves selection, decoding, demodulation, and post-equalization of a light sensor. Since in the visible light communication, brightness of light is modulated with a high frequency that cannot be recognized by a human eye, integration of illumination and communication may be achieved. However, communication and display are integrated, so that a display screen may be used not only as a display interface, but also as a communication interface, to achieve integration of communication and display, is another innovative breakthrough point in VLC and the field of display, and an integration solution of illumination and communication may provide important technical support, especially for the Internet of Everything technology that needs large capacity and high-speed communication.

SUMMARY

The following is a summary of subject matter described herein in detail. The summary is not intended to limit the protection scope of claims.

An embodiment of the present disclosure provides a display substrate including an effective display region and a peripheral region surrounding the effective display region, and the display substrate includes a base substrate and a display unit, a light receiving unit, and a light emission unit located on the base substrate, wherein the display unit is located in the effective display region and includes multiple light emitting sub-pixels; the light receiving unit is located in at least one of following regions: a first light transceiving region and a second light transceiving region, and the light emission unit is located in at least one of following regions: a first light transceiving region and a second light transceiving region, wherein the first light transceiving region is located in the peripheral region and is one or more annular regions surrounding the effective display region, and the second light transceiving region is located between multiple light emitting sub-pixels of the effective display region; the light receiving unit is configured to receive a light signal carrying communication information and convert the light signal into an electrical signal, and the light emission unit is configured to convert an electrical signal into a light signal carrying communication information and emit the light signal.

In some exemplary implementation modes, the light receiving unit includes a visible light receiving unit and/or an infrared light receiving unit, and the light emission unit includes a visible light emission unit and/or an infrared light emission unit.

In some exemplary implementation modes, the peripheral region includes a cathode lap region, the first light transceiving region includes a first sub-transceiving region and a second sub-transceiving region, the first sub-transceiving region is located between the cathode lap region and an edge of the display substrate, and the second sub-transceiving region is located between the cathode lap region and the effective display region.

In some exemplary implementation modes, the infrared light emission unit is located in the second sub-transceiving region, the visible light receiving unit and the infrared light receiving unit are both located in the first sub-transceiving region, and the visible light receiving unit is located on a side of the infrared light receiving unit away from the effective display region.

In some exemplary implementation modes, the visible light receiving unit and the infrared light receiving unit are photodiodes.

In some exemplary implementation modes, the light receiving unit is continuously disposed around the effective display region; or, the light receiving unit includes multiple photosensitive devices dispersedly disposed around the effective display region.

In some exemplary implementation modes, on a plane perpendicular to the display substrate, the display substrate includes the base substrate, a light device layer disposed on the base substrate, an encapsulation layer disposed on a side of the light device layer away from the base substrate, a light filter layer disposed on a side of the encapsulation layer away from the light device layer, the light device layer includes the light emitting sub-pixels, the infrared light emission unit, the visible light receiving unit, and the infrared light receiving unit, the light filter layer includes a blue light filter layer and an infrared light filter layer, an orthographic projection of the blue light filter layer on the base substrate covers an orthographic projection of the visible light receiving unit on the base substrate, and an orthographic projection of the infrared light filter layer on the base substrate covers an orthographic projection of the infrared light receiving unit on the base substrate.

In some exemplary implementation modes, the display substrate further includes a polarizer layer disposed on a side of the light filter layer away from the base substrate, or disposed between the light filter layer and the encapsulation layer.

In some exemplary implementation modes, a visible light shielding wall is provided between the visible light receiving unit and the infrared light receiving unit, and an infrared light shielding wall is provided between the infrared light receiving unit and the cathode lap region.

In some exemplary implementation modes, the infrared light emission unit includes multiple infrared organic light emitting diodes, the light emitting sub-pixels include multiple organic light emitting diodes, and the light device layer includes an anode layer, a hole injection layer, a hole transport layer, an emitting layer, an electron transport layer, an electron injection layer, and a cathode layer disposed on the base substrate sequentially, and the emitting layer includes a visible light emitting layer and an infrared light emitting layer.

In some exemplary implementation modes, the visible light receiving unit and the infrared light receiving unit are both located in the first sub-transceiving region, and the visible light receiving unit and the infrared light receiving unit are alternately arranged around the effective display region.

In some exemplary implementation modes, the infrared light emission unit and the infrared light receiving unit are both located in the second sub-transceiving region, the visible light receiving unit is located in the first sub-transceiving region, and the infrared light receiving unit is located on a side of the infrared light emission unit away from the effective display region.

In some exemplary implementation modes, the infrared light receiving unit includes multiple infrared organic photosensitive devices, and an infrared organic photosensitive device includes a reflective electrode layer, a hole transport layer, a near-infrared light active layer, an electron transport layer, and a transparent electrode layer that are sequentially disposed on the base substrate.

In some exemplary implementation modes, the infrared light receiving unit includes multiple infrared silicon-based photosensitive devices.

In some exemplary implementation modes, a visible light shielding wall is provided between the visible light receiving unit and the cathode lap region, and an infrared light shielding wall is provided between the infrared light receiving unit and the infrared light emission unit.

In some exemplary implementation modes, the visible light receiving unit includes multiple visible light organic photosensitive devices, and a visible light organic photosensitive device includes a reflective electrode layer, a hole transport layer, a visible light active layer, an electron transport layer, and a transparent electrode layer sequentially disposed on the base substrate.

In some exemplary implementation modes, the visible light receiving unit includes multiple visible light silicon-based photosensitive devices.

In some exemplary implementation modes, the infrared light receiving unit includes multiple infrared organic photosensitive devices, the visible light receiving unit includes multiple visible light organic photosensitive devices, the multiple infrared organic photosensitive devices and the multiple visible light organic photosensitive devices are disposed around the effective display region, and one or more infrared organic photosensitive devices and one or more visible light organic photosensitive devices are alternately arranged.

In some exemplary implementation modes, an infrared light shielding wall is provided between the infrared organic photosensitive devices and the infrared light emission unit, and a visible light shielding wall is provided between the visible light organic photosensitive devices and the infrared light emission unit.

In some exemplary implementation modes, the infrared light receiving unit includes multiple infrared organic photosensitive devices, the visible light receiving unit includes multiple visible light organic photosensitive devices, the light emission unit includes multiple light emission devices, the multiple infrared organic photosensitive devices, the multiple visible light organic photosensitive devices, and the multiple light emission devices are disposed around the effective display region, and one or more infrared organic photosensitive devices, one or more visible light organic photosensitive devices, and one or more light emission devices are alternately arranged around the effective display region; light shielding walls are respectively disposed between the light emission devices and the infrared organic photosensitive devices, and between the light emission devices and the visible light organic photosensitive devices.

In some exemplary implementation modes, the multiple light emitting sub-pixels include red light sub-pixels, green light sub-pixels, and blue light sub-pixels, and a red light sub-pixel, a green light sub-pixel, and a blue light sub-pixel that are adjacent are arranged in a triangular configuration; in the second light transceiving region, the infrared light emission unit is located between two adjacent light emitting sub-pixels, the visible light receiving unit is located between two adjacent light emitting sub-pixels, the infrared light receiving unit is located between two adjacent light emitting sub-pixels, and the infrared light emission unit, the visible light receiving unit, and the infrared light receiving unit that are adjacent are arranged in a triangular configuration.

In some exemplary implementation modes, in the second light transceiving region, the infrared light emission unit is located between a red light sub-pixel and a green light sub-pixel that are adjacent; the visible light receiving unit is located between a red light sub-pixel and a blue light sub-pixel that are adjacent, or located between a blue light sub-pixel and a green light sub-pixel that are adjacent; the infrared light receiving unit is located between a blue light sub-pixel and a green light sub-pixel that are adjacent, or located between a red light sub-pixel and a blue light sub-pixel that are adjacent.

In some exemplary implementation modes, the multiple light emitting sub-pixels include red light sub-pixels, green light sub-pixels, and blue light sub-pixels, and in two columns of light emitting sub-pixels that are adjacent, red light sub-pixels and green light sub-pixels are alternately arranged along a second direction to form one column, and blue light sub-pixels form the other column; in the second light transceiving region, multiple infrared light emission units, visible light receiving units, and infrared light receiving units are arranged in multiple rows along a first direction, and an infrared light emission unit, a visible light receiving unit, and an infrared light receiving unit are all located between two adjacent blue light sub-pixels in the second direction.

In some exemplary implementation modes, the multiple infrared light emission units are respectively arranged in multiple rows along the first direction, the multiple visible light receiving units are respectively arranged in multiple rows along the first direction, the multiple infrared light receiving units are arranged in multiple rows along the first direction, and the infrared light emission units, the visible light receiving units, and the infrared light receiving units are alternately arranged in the second direction.

In some exemplary implementation modes, a width of a blue light sub-pixel along the first direction is equal to a width of a red light sub-pixel along the first direction, and the width of the blue light sub-pixel along the first direction is equal to a width of a green light sub-pixel along the first direction; a length of a blue light sub-pixel along the second direction is larger than a length of a red light sub-pixel along the second direction, the length of the blue light sub-pixel along the second direction is larger than a length of a green light sub-pixel along the second direction, and the length of the blue light sub-pixel along the second direction is smaller than a sum of the lengths of the red light sub-pixel and the green light sub-pixel along the second direction.

In some exemplary implementation modes, in the second light transceiving region, each light receiving unit is isolated from an adjacent light emitting sub-pixel through a light shielding wall or a light shielding pixel definition layer.

In some exemplary implementation modes, the multiple infrared light emission units are respectively arranged in multiple rows along the first direction, the multiple visible light receiving units and infrared light receiving units are alternately arranged in multiple rows along the first direction, and the infrared light emission unit, the visible light receiving unit, and the infrared light receiving unit are alternately arranged in the second direction.

In some exemplary implementation modes, the blue light sub-pixels include a first blue light sub-pixel and a third blue light sub-pixel, and an infrared light emission unit includes a second blue light sub-pixel and an infrared light color conversion layer, and the infrared light color conversion layer is configured to convert blue visible photons emitted by the second blue light sub-pixel into near-infrared photons through near-infrared quantum tailoring; the first blue light sub-pixel, the second blue light sub-pixel, and the third blue light sub-pixel are alternately disposed along the second direction, the second blue light sub-pixel is disposed between the first blue light sub-pixel and the third blue light sub-pixel, and the second blue light sub-pixel is located in a same pixel opening as the first blue light sub-pixel and the third blue light sub-pixel.

In some exemplary implementation modes, on a plane perpendicular to the display substrate, the display substrate includes the base substrate, a light device layer disposed on the base substrate, an encapsulation layer dispose on a side of the light device layer away from the base substrate, a light filter-and-color conversion layer dispose on a side of the encapsulation layer away from the light device layer, the light device layer includes the light emitting sub-pixels, the visible light receiving units, and the infrared light receiving units, the light filter-and-color conversion layer includes a blue light filter layer, an infrared light filter layer, and the infrared light color conversion layer, an orthographic projection of the blue light filter layer on the base substrate covers an orthographic projection of the visible light receiving unit on the base substrate, an orthographic projection of the infrared light filter layer on the base substrate covers an orthographic projection of the infrared light receiving unit on the base substrate, and an orthographic projection of the infrared light color conversion layer on the base substrate covers an orthographic projection of the second blue light sub-pixel on the base substrate.

In some exemplary implementation modes, a distance between the first blue light sub-pixel and the second blue light sub-pixel along the second direction is equal to a distance between the second blue light sub-pixel and the third blue light sub-pixel along the second direction.

In some exemplary implementation modes, a distance between the second blue light sub-pixel and the third blue light sub-pixel along the second direction is smaller than a distance between the third blue light sub-pixel and an infrared light receiving unit or a visible light receiving unit adjacent to the third blue light sub-pixel.

In some exemplary implementation modes, a distance between the first blue light sub-pixel and the second blue light sub-pixel along the second direction is less than ½ of a distance between the third blue light sub-pixel and a red light sub-pixel adjacent to the third blue light sub-pixel along the first direction.

In some exemplary implementation modes, the visible light emission unit is one or more light emitting sub-pixels, and the one or more light emitting sub-pixels are located within the effective display region.

An embodiment of the present disclosure further provides a display apparatus, including the display substrate as described in any one of the above.

An embodiment of the present disclosure further provides a visible light communication system, which includes at least two display apparatuses as described above; or, includes at least one display apparatus as described above and an illumination system, the illumination system includes an emission light source, a preprocessing coding and modulation module, and a light receiver; the preprocessing coding and modulation module is configured to perform preprocessing coding and modulation on a network signal or a communication signal; the emission light source is configured to emit visible light for illumination, and emit a signal modulated by the preprocessing coding and modulation module in a form of a high-frequency signal with the visible light; and the light receiver is configured to receive a light signal carrying communication information and convert the light signal into an electrical signal.

In some exemplary implementation modes, the emission light source is an LED emission light source.

In some exemplary implementation modes, the light receiver includes at least one of a visible light receiver and an infrared light receiver.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure but not to constitute limitations on the technical solutions of the present disclosure. Shapes and sizes of various components in the drawings do not reflect actual scales, and are only intended to schematically illustrate contents of the present disclosure.

DETAILED DESCRIPTION

Figure 1:
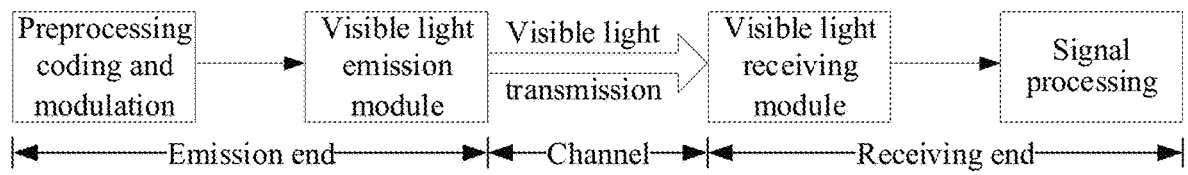
FIG. 1 is a schematic diagram of a structure of a VLC system.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation mode of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

Visible Light Communication (VLC) technology is a new wireless transmission technology that uses a visible light spectrum (such as light emitted by a bulb) to transmit data. Referring to FIG. 1, a VLC system mainly includes an emission end, a channel, and a receiving end, and a receiving technology is a very important part in the visible light communication, which mainly involves selection, decoding, demodulation, and post-equalization of a light sensor. Since in the visible light communication, brightness of light is modulated with a high frequency that cannot be recognized by a human eye, integration of illumination and communication may be achieved. However, integrating communication and display, so that a display screen may be used not only as a display interface, but also as a communication interface, to achieve integration of communication and display, is another innovative breakthrough point in VLC and the field of display, and an integration solution of illumination and communication may provide important technical support, especially for the Internet of Everything technology that needs large capacity and high-speed communication.

In the visible light communication, an emission end of indoor illumination LED usually broadcasts data to each indoor terminal through visible light, which constitutes a downlink of the visible light communication. Visible light communication systems in related technologies mostly contain unidirectional visible light downlinks, however a complete communication system must have a cooperative uplink.

An embodiment of the present disclosure provides a display substrate including an effective display region and a peripheral region surrounding the effective display region, and the display substrate includes a base substrate and a display unit, a light receiving unit, and a light emission unit located on the base substrate, wherein the display unit is located in the effective display region and includes multiple light emitting sub-pixels; the light receiving unit is located in at least one of following regions: a first light transceiving region and a second light transceiving region, and the light emission unit is located in at least one of following regions: a first light transceiving region and a second light transceiving region, wherein the first light transceiving region is located in the peripheral region and is one or more annular regions surrounding the effective display region, and the second light transceiving region is located between multiple light emitting sub-pixels of the effective display region; the light receiving unit is configured to receive a light signal carrying communication information and convert it into an electrical signal; the light emission unit is configured to convert an electrical signal into a light signal carrying communication information and emit the light signal.

According to the display substrate of the embodiment of the present disclosure, by arranging a display unit, a light receiving unit, and a light emission unit, an integration solution of integrating an uplink and downlink two-way light communication technology and display is provided, which may not only achieve two-way communication between a display terminal and an LED emission end of an illumination system, but also achieve two-way communication between display terminals.

In some exemplary implementation modes, the light receiving unit may include a visible light receiving unit and/or an infrared light receiving unit, and the light emission unit may include a visible light emission unit and/or an infrared light emission unit.

In an integration technology of integrating visible light communication and display, an uplink is more suitable for selecting a light wave uplink solution, which may have a higher degree of integration in this way. However, in some application scenarios, such as a mobile phone or a television, using a visible light uplink solution in a display terminal may cause visual interference to a human eye, since infrared light is invisible to human eyes, it is more in line with users' requirements for an uplink in practical applications. Moreover, unlike visible light, which needs to ensure comfort of human eyes, an intensity of infrared light may be changed rapidly and greatly. In other application scenarios, when using a visible light uplink solution will not cause visual interference to a human eye, it is better to adopt the visible light uplink solution.

An embodiment of the present disclosure further provides a visible light communication system, which includes at least two display apparatuses; or, includes at least one display apparatus and an illumination system. The illumination system includes an emission light source, a preprocessing coding and modulation module, and a light receiver. The preprocessing coding and modulation module is configured to perform preprocessing coding and modulation on a network signal or a communication signal. The emission light source is configured to emit visible light for illumination, and emit a signal modulated by the preprocessing coding and modulation module in a form of a high-frequency signal with the visible light. The light receiver is configured to receive a light signal carrying communication information and convert the light signal into an electrical signal.

In some exemplary implementation modes, the emission light source may be an LED emission light source.

In some exemplary implementation modes, the light receiver may include at least one of: a visible light receiver and an infrared light receiver.

Figure 2A:
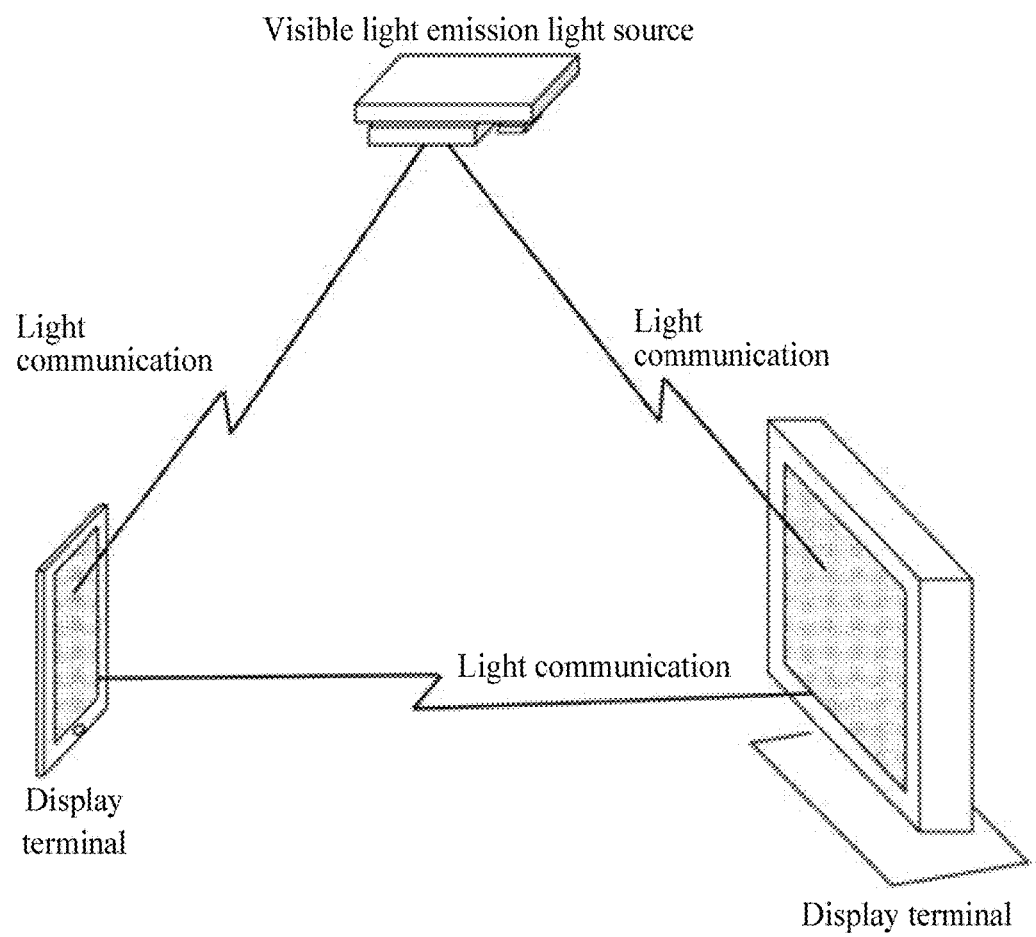
FIG. 2a is a schematic diagram of a structure of a VLC system according to an exemplary embodiment of the present disclosure.
Figure 2B:
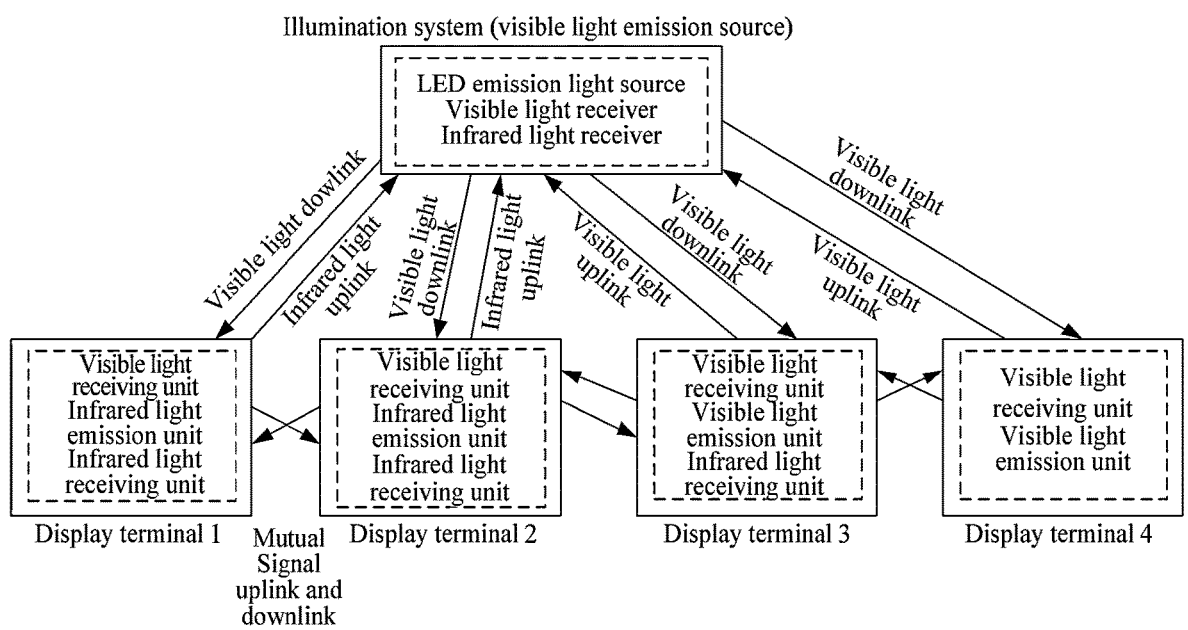
FIG. 2b is a schematic diagram of a structure of another VLC system according to an exemplary embodiment of the present disclosure.

As shown in FIGS. 2a and 2b, when an infrared uplink solution is adopted, in order to achieve two-way communication between a display terminal and an LED emission end of an illumination system, the illumination system must at least have an LED emission light source and an infrared light receiver (currently a commercially available infrared light receiver product is very cheap), and the LED emission light source emits a downlink visible light signal, and then a visible light receiving unit on the display terminal receives the downlink visible light signal. An infrared light emission unit on the display terminal emits an uplink infrared light signal invisible to a naked eye, and then an infrared light receiver on the illumination system receives the uplink infrared light signal, finally achieving uplink-downlink two-way high-speed communication between the display terminal and the illumination system. When a solution of visible light uplink is adopted, an illumination system should at least have an LED emission light source and a visible light receiver, wherein the LED emission light source emits a downlink visible light signal, and then a visible light receiving unit on a display terminal receives the downlink visible light signal; an uplink visible light signal is emitted by a visible light emission unit on the display terminal, and then the uplink visible light signal is received by the visible light receiver on the illumination system, thereby achieving uplink-downlink two-way high-speed communication between the display terminal and the illumination system.

In some exemplary implementation modes, the illumination system in the embodiment of the present disclosure may be an indoor or outdoor LED illumination system. In addition that an LED emission light source must be included, the illumination system also needs to include a preprocessing coding and modulation module and a light receiver (i.e., a photosensitive receiving sensor). The light receiver may be a visible light receiver or an infrared light receiver, and only one or both of them may be included depending on an application scenario. Among them, an LED illumination source emits visible light and plays an role of illumination, while a network signal or communication signal is emitted, with LED visible light, in a form of a high-frequency signal after passing through the preprocessing coding and modulation module. The light receiver is used for receiving an uplink light signal sent by another terminal device. In some exemplary implementation modes, in addition to the visible light receiving unit, the display terminal in the embodiment of the present disclosure may include only one or a combination of or all of an infrared light receiving unit, an infrared light emission unit, and a visible light emission unit depending on different application scenarios.

In some exemplary implementation modes, the LED emission light source described in the present disclosure may not be limited to be used in an illumination function system, and may also be used in another system only for performing a function of visible light communication. For example, the LED emission light source is installed on some terminal devices, and is not used for serving a role of high-power illumination, but is only used for emitting a visible light signal to achieve visible light communication function.

In some exemplary implementation modes, the display terminal described in the present disclosure includes a thin film transistor base substrate, a display unit, a light receiving unit, a light emission unit, and other functional film layers thereon, etc., wherein the functional film layers include, but are not limited to, an encapsulation layer, a light filter layer, a touch panel layer, a polarizer (POL) layer, an optically transparent adhesive layer, a protective film layer, etc.

In some exemplary implementation modes, the thin film transistor base substrate mainly includes a first drive unit corresponding to the display unit, a second drive unit corresponding to the light receiving unit, a third drive unit corresponding to the light emission unit, and regions corresponding to display and communication functions, etc. The display unit is connected to the first drive unit, and a displayed pattern is controlled through the first drive unit. The light receiving unit is connected to the second drive unit, and a certain bias voltage is controlled through the second drive unit and a current is output. The light emission unit is connected to the third drive unit, and an emitted light signal is controlled through the third drive unit.

In some exemplary implementation modes, the light receiving unit may be a visible light receiving unit, or an infrared light receiving unit, or both. The light emission unit may be a visible light emission unit, or an infrared light emission unit, or both. The light receiving unit in the display terminal is configured to receive a light signal emitted from the illumination system or another display terminal (the light signal contains communication information such as text, audio and video) and convert the light signal into an electrical signal. The light emission unit in the display terminal is configured to emit a light signal to the outside, such as to an illumination system or another display terminal, and the light emission unit converts an electrical signal into a light signal, and the emitted light signal also contains communication information.

In some exemplary implementation modes, the display unit described in the present disclosure includes three kinds of light emitting sub-pixels, red, green, and blue (RGB), formed in a certain arrangement order, and is used for displaying a picture. The display unit may be an organic light-emitting diode (OLED) device, or a light-emitting diode (LED) device, such as a Mini-LED, a Micro-LED, or a Liquid Crystal Display (LCD) device, which is not limited in the present disclosure.

As shown in FIG. 2b, to achieve two-way communication between display terminals, one method is to use an illumination system as a medium, an uplink infrared light signal is emitted by an infrared light emission unit on a display terminal 1, then, the illumination system receives the uplink infrared light signal, and a processed signal is emitted by an LED emission light source in the illumination system in a form of a downlink visible light signal, and a visible light receiving unit on a display terminal 2 receives the downlink visible light signal, finally achieving two-way high-speed communication between the display terminal 1 and the display terminal 2. Another method is to emit an infrared light signal by an infrared light emission unit on a display terminal 1 when there is no illumination system, and then the infrared light signal is directly received by an infrared light receiving unit on a display terminal 2, finally achieving two-way high-speed communication between the display terminal 1 and the display terminal 2. On the contrary, in the above two methods, a signal may also be emitted by the display terminal 2 and then received by the display terminal 1 to achieve two-way high-speed communication.

For some display terminals, such as an industrial control display screen, there is no need to change pictures as frequently as a mobile phone or a TV screen, but background light is always bright, and the rest parts are only used for displaying numbers and so on. In this case, for a display terminal, a visible light emission unit may be used as a signal emission unit, and this kind of device achieves a two-way light communication function in a follow manner: as shown in FIG. 2b, a display terminal 3 uses normally bright background light as a visible light emission light source to emit a visible light signal, and then the visible light signal is received by a visible light receiving unit on a display terminal 4. At the same time, a visible light signal emitted by a visible light emission unit on the display terminal 4 may also be received by a visible light receiving unit on the display terminal 3, and finally two-way communication between display terminals is achieved. In a same way, between a display terminal and an illumination system, visible light may also be used as emission and receiving light sources for communication.

For the above two kinds of two-way communication, methods are different, and application scenarios are also different. For example, two-way communication between a display terminal and an illumination system is mainly used for communication between a terminal product and an entire internet system, while two-way communication between display terminals is mainly used for a scenario when terminal products need to communicate with each other.

In some exemplary implementation modes, a peripheral region 200 includes a cathode lap region 202, and a first light transceiving region includes a first sub-transceiving region 203 and a second sub-transceiving region 201. The first sub-transceiving region 203 is located between the cathode lap region 202 and an edge of a display substrate, and the second sub-transceiving region 201 is located between the cathode lap region 202 and an effective display region 100.

In this embodiment, the second sub-transceiving region 201, the cathode lap region 202, and the first sub-transceiving region 203 are sequentially disposed along a direction away from the effective display region 100. An encapsulation layer 608 of the second sub-transceiving region 201 is a stacked structure of inorganic material/organic material/inorganic material, and the encapsulation layer 608 of the cathode lap region 202 and the first sub-transceiving region 203 is a stacked structure of inorganic material/inorganic material.

In some exemplary implementation modes, the second sub-transceiving region 201 may also be referred to as a circuit region which may include a gate drive circuit, wherein the gate drive circuit is connected to a scan signal line of a pixel drive circuit in the effective display region 100.

In some exemplary implementation modes, the cathode lap region 202 may include a connection electrode, a cathode is lapped with the connection electrode in the cathode lap region 202, and the connection electrode is connected to a power supply line (VSS).

In some exemplary implementation modes, the first sub-transceiving region 203 may also be referred to as an isolation dam region, which may include a power supply line and an isolation dam. The power supply line extends along a direction parallel to an edge of the effective display region 100 and is configured to transmit a low voltage signal to multiple display units in the effective display region 100. The isolation dam extends along the direction parallel to the edge of the effective display region 100 and is configured to block water vapor entering the effective display region 100 from the peripheral region 200.

In some exemplary implementation modes, the peripheral region 200 may further include a crack dam region disposed on a side of the first sub-transceiving region 203 away from the effective display region 100 and a cutting region disposed on a side of the crack dam region away from the effective display region 100. The crack dam region is configured to reduce a force on the effective display region 100 and the circuit region in a cutting process, avoid affecting a film layer structure of the effective display region 100 and the circuit region, and cut off transmission of a crack towards the effective display region 100 and the circuit region. In an exemplary implementation mode, the cutting region includes a cutting groove(s), and the cutting groove is configured so that after all film layers of the display substrate are prepared, a cutting device cuts along the cutting groove(s) respectively.

Figure 3:
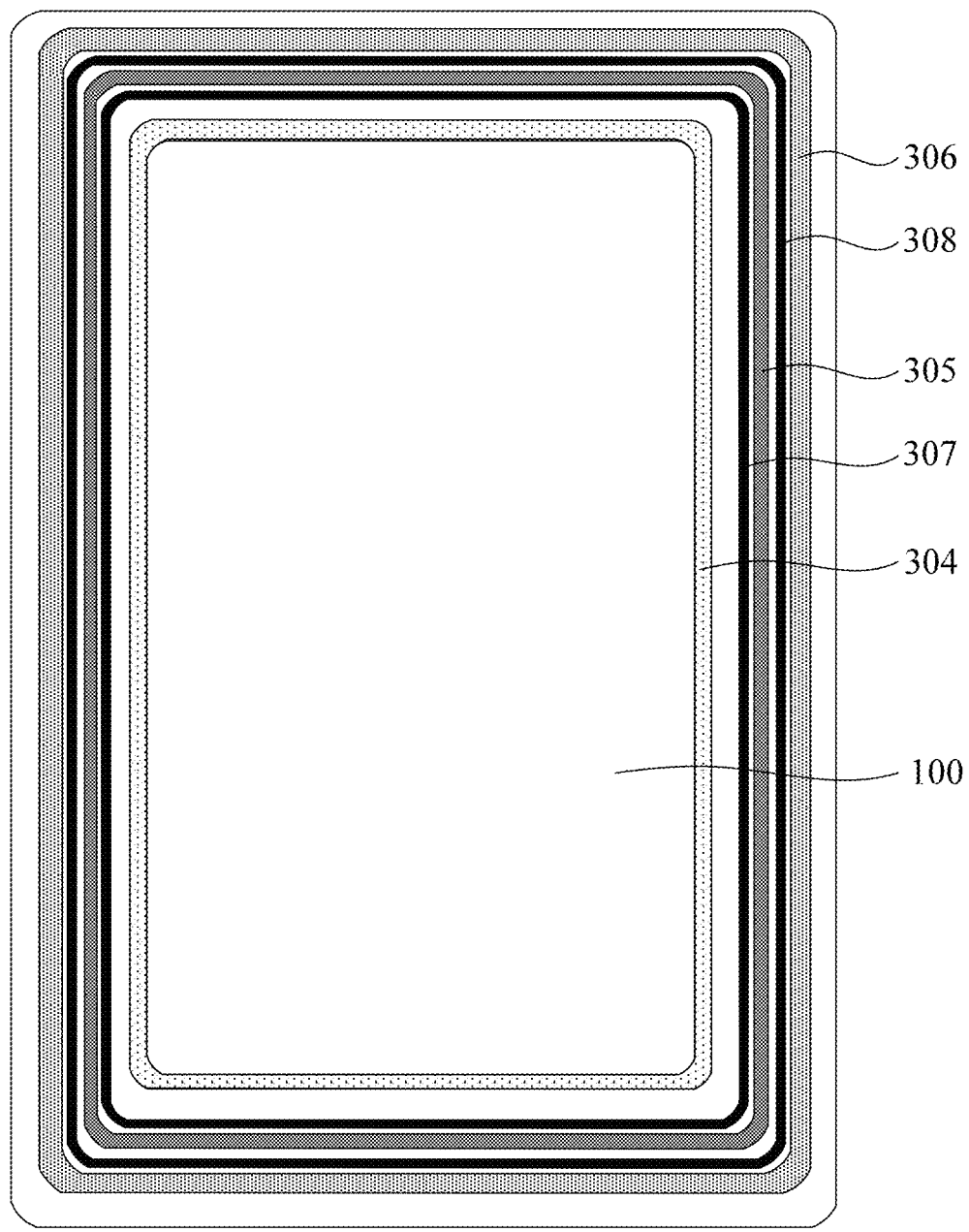
FIG. 3 is a schematic diagram of a structure of a display substrate according to an exemplary embodiment of the present disclosure.
Figure 4:
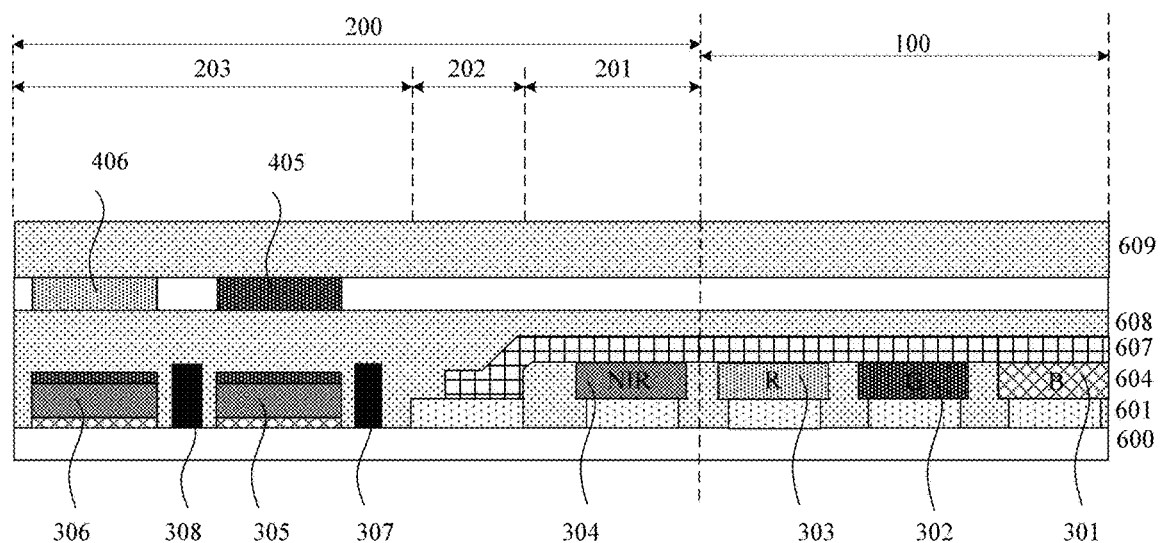
FIG. 4 is a cross-sectional view of the display substrate in FIG. 3.

As shown in FIGS. 3 and 4, the display substrate includes an infrared light emission unit 304, a visible light receiving unit 306, and an infrared light receiving unit 305. The infrared light emission unit 304 is located in the second sub-transceiving region 201, the visible light receiving unit 306 and the infrared light receiving unit 305 are located in the first sub-transceiving region 203, and the visible light receiving unit 306 is located on a side of the infrared light receiving unit 305 away from the effective display region 100.

Figure 5:
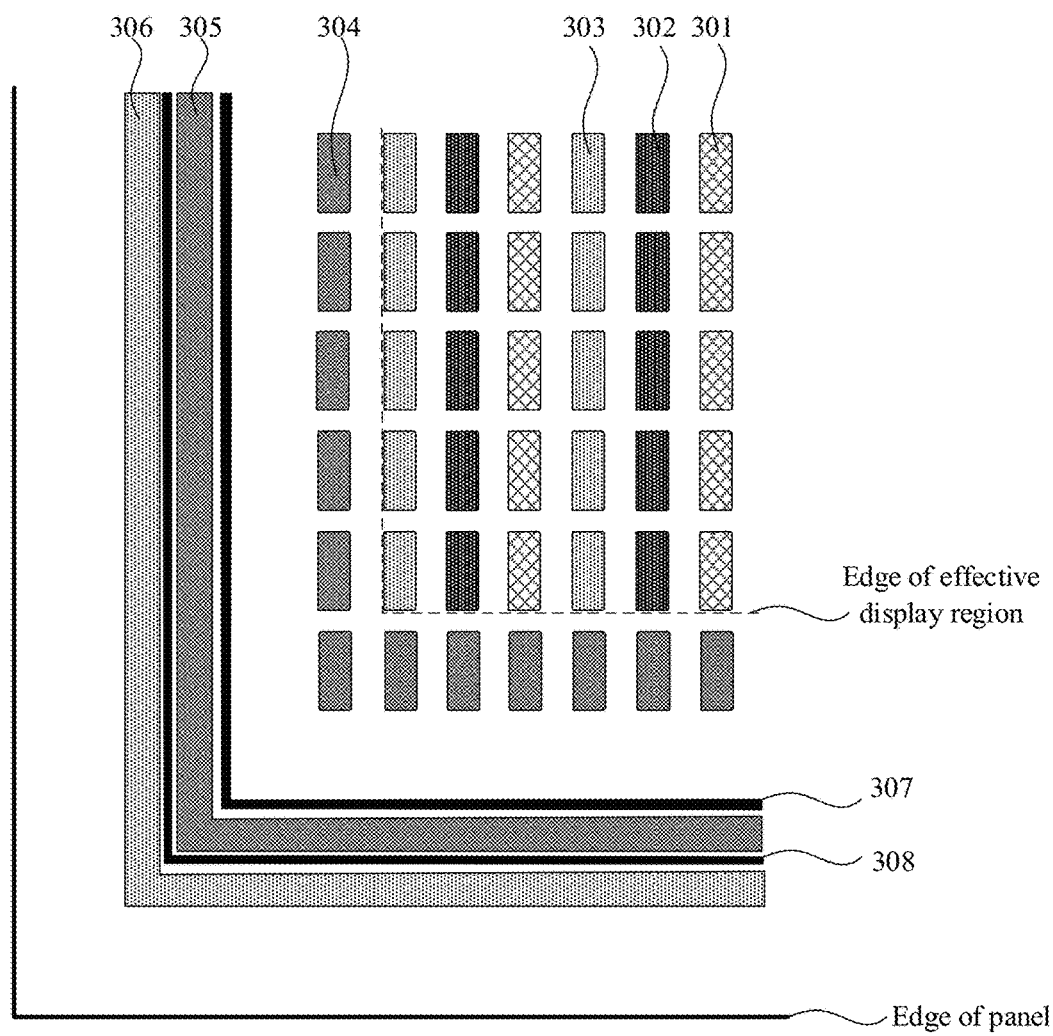
FIG. 5 is a cross-sectional view of a lower left corner region of the display substrate in FIG. 3.

In this embodiment, as shown in FIGS. 3, 4, and 5, the visible light receiving unit 306 and the infrared light receiving unit 305 are respectively disposed in an annular region of a periphery of the effective display region 100, and their positions may be between an outer side of the cathode lap region 202 and an edge of an encapsulation region. In this way, a pixel arrangement and a pixel density in the effective display region 100 will not be affected, and a sufficient receiving area may be ensured, a communication rate may be improved, and blocking of light signal caused by centralized arrangement of receiving regions in a local region may be avoided.

In some other exemplary embodiments, the infrared light receiving unit 305 may also be placed on an outer side of the visible light receiving unit 306, that is, the infrared light receiving unit 305 is located on a side of the visible light receiving unit 306 away from the effective display region 100. Or, the infrared light emission unit 304 may be placed on an outer side of the visible light receiving unit 306 and the infrared light receiving unit 305, that is, the visible light receiving unit 306 and the infrared light receiving unit 305 are located on a side of the infrared light emission unit 304 close to the effective display region 100. That is, an arrangement order of the infrared light emission unit 304, the infrared light receiving unit 305, and the visible light receiving unit 306 may be adjusted as needed, which is not limited in the present disclosure.

In some exemplary implementation modes, the visible light receiving unit 306 and the infrared light receiving unit 305 may be photodiodes, a PIN structure or a heterojunction structure may be used. The visible light receiving unit 306 and the infrared light receiving unit 305 with the above structure have a similar manufacturing process, and peak absorption wavelengths of two devices at visible light (such as blue light) and near-infrared light may be respectively adjusted by adjusting processes. The manufacturing process is simple and highly compatible with a manufacturing process of a thin film transistor base substrate.

In some exemplary implementation modes, the light receiving unit is disposed continuously around the effective display region 100; or, the light receiving unit includes multiple photosensitive devices dispersedly disposed around the effective display region 100.

In some exemplary implementation modes, the visible light receiving unit 306 and/or the infrared light receiving unit 305 may be made into a continuous whole circle device structure within the first sub-transceiving region 203, or may be made into a large number of photosensitive devices with small areas, multiple photosensitive devices are uniformly distributed in the first sub-transceiving region 203, and a shape of a photosensitive device may be one or more of a square, a circle, a rectangle, a rhombus, or an ellipse.

In some exemplary implementation modes, on a plane perpendicular to the display substrate, the display substrate includes a base substrate 600, a light device layer disposed on the base substrate 600, an encapsulation layer 608 disposed on a side of the light device layer away from the base substrate 600, a light filter layer disposed on a side of the encapsulation layer 608 away from the light device layer. The light device layer includes an infrared light emission unit 304, a visible light receiving unit 306, and an infrared light receiving unit 305, the light filter layer includes a blue light filter layer 406 and an infrared light filter layer 405, wherein an orthographic projection of the blue light filter layer 406 on the base substrate 600 covers an orthographic projection of the visible light receiving unit 306 on the base substrate 600 and an orthographic projection of the infrared light filter layer 405 on the base substrate 600 covers an orthographic projection of the infrared light receiving unit 305 on the base substrate 600.

When the visible light emission unit is a white fluorescent LED, for the display substrate of the embodiment of the present disclosure, the blue light filter layer 406 may be provided above the visible light receiving unit 306, to filter out yellow light in an emission end of the fluorescent LED and retain only a blue light component, the infrared light filter layer 405 may be provided above the infrared light receiving unit 305 to filter out other stray light in an external environment and retain only an infrared light component, thereby improving a communication modulation bandwidth, while other regions are transparent film layers, which do not affect a display effect of the effective display region 100, as shown in FIG. 4. In some exemplary implementation modes, a material of the blue light filter layer 406 may be a conventional organic blue light filter material, a quantum dot material, or the like, and a material of the infrared light filter layer 405 may be a black or deep red material with Polycarbonate (PC) resin plastic and Polymethyl Methacrylate (PMMA) as a base material, but is not limited to the materials listed above.

In some exemplary implementation modes, on a plane perpendicular to the display substrate, the display substrate further includes a polarizer (POL) layer 609, wherein the polarizer layer 609 is disposed on a side of the light filter layer away from the base substrate 600, or disposed between the light filter layer and the encapsulation layer 608.

In this embodiment, the light filter layer may be disposed on a side of the polarizer layer 609 away from the base substrate 600 or on a side of the polarizer layer 609 close to the base substrate 600. However, considering that a polarizer itself plays a role in filtering stray light in sunlight, a better effect is achieved if the light filter layer is disposed on a side of the polarizer layer 609 close to the base substrate 600.

In some exemplary implementation modes, a visible light shielding wall 308 is disposed between the visible light receiving unit 306 and the infrared light receiving unit 305, and an infrared light shielding wall 307 is disposed between the infrared light receiving unit 305 and the cathode lap region 202.

In this embodiment, as shown in FIGS. 3, 4, and 5, an annular visible light shielding wall 308 and an annular infrared light shielding wall 307 are respectively provided immediately adjacent to inner sides of the visible light receiving unit 306 and the infrared light receiving unit 305 (i.e., in a direction close to the effective display region 100), which may prevent visible light within the effective display region 100 and infrared light at an edge of the effective display region 100 from causing signal interference to a light receiving unit. In some exemplary implementation modes, a material of the visible light shielding wall 308 may be a photoresist resin material for making a black matrix. A material of the infrared light shielding wall 307 may be a reflective or absorbent infrared cut-off material. In some exemplary implementation modes, heights of the visible light shielding wall 308 and the infrared light shielding wall 307 may be equal to a height of a pixel definition layer (PDL) or slightly higher than a height of the light receiving unit.

In some exemplary implementation modes, as shown in FIG. 3, FIG. 4, and FIG. 5, the infrared light emission unit 304 is disposed in an annular region on an outer side of an edge of the effective display region 100, which is adjacent to display sub-pixels of an outermost circle in the effective display region 100.

Figure 6:
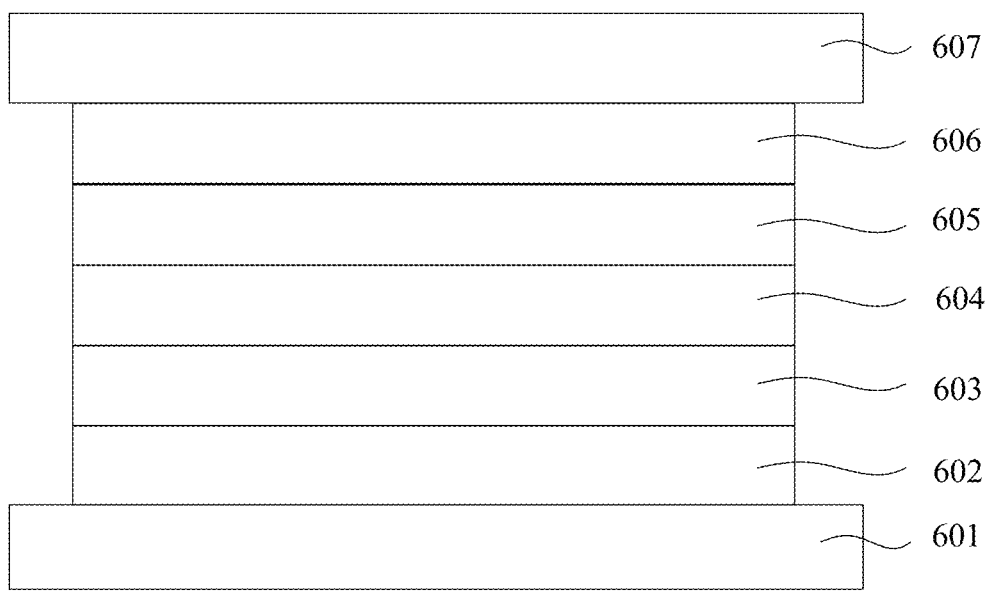
FIG. 6 is a schematic diagram of a structure of an infrared light emission unit according to an exemplary embodiment of the present disclosure.
Figure 7:
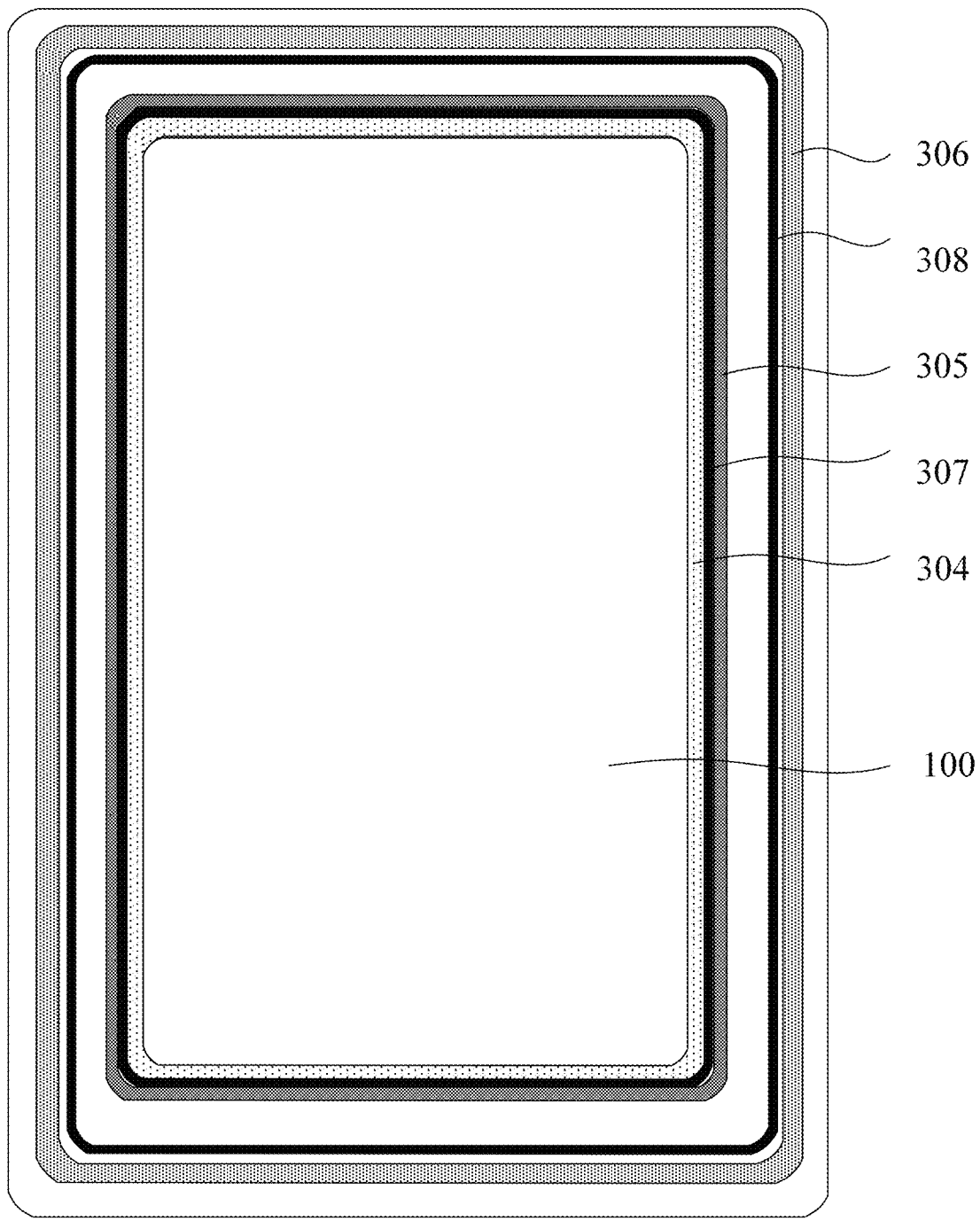
FIG. 7 is a schematic diagram of a structure of another display substrate according to an exemplary embodiment of the present disclosure.
Figure 8:
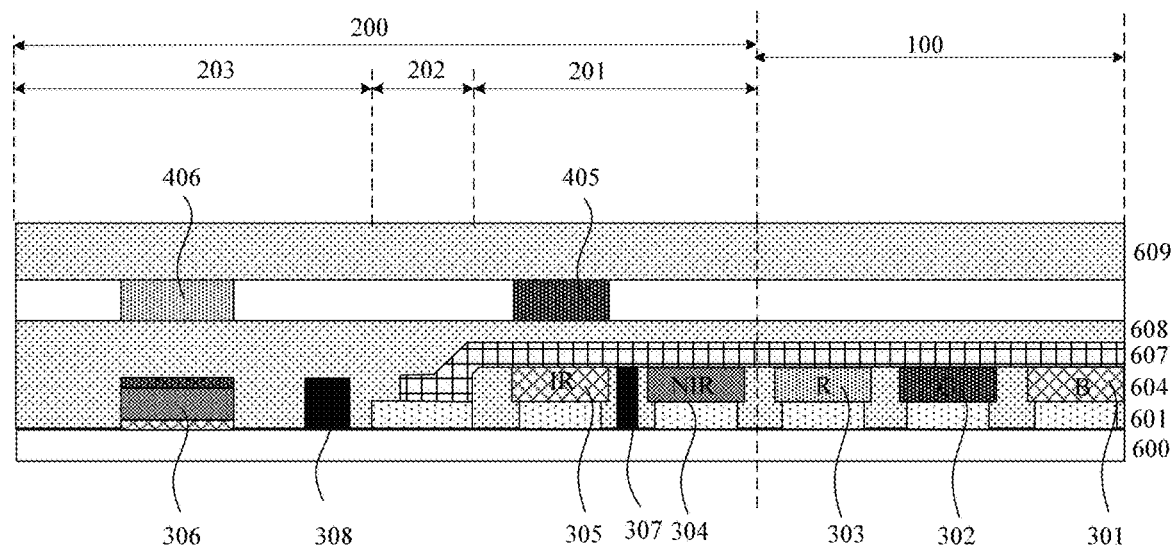
FIG. 8 is a cross-sectional view of the display substrate in FIG. 7.

In some exemplary implementation modes, for the infrared light emission unit 304, a Near-Infrared light Organic Light Emitting Diode (NIR-OLED) device structure may be used, the display unit in the effective display region 100 may be an OLED device structure, in this way, the two structures are consistent, as shown in FIG. 6, an NIR-OLED device and the OLED device structure each include an anode layer 601, a hole injection layer (HIL) 602, a hole transport layer (HTL) 603, an emitting layer (EML) 604, an electron transport layer (ETL) 605, an electron injection layer (EIL) 606, and a cathode layer 607, a difference lies in the emitting layer 604 in the middle, the emitting layer 604 of the OLED device structure emits red, green, and blue visible light, the emitting layer 604 of the NIR-OLED device emits invisible near-infrared light, therefore, the infrared light emission unit 304 using this structure has a greatly simplified device structure and manufacturing process, which may be kept the same as an existing OLED device manufacturing process, for example, it may be prepared using a vacuum thermal evaporation method, an ink-jet printing method, or a laser thermal transfer printing method, etc., which is not limited in the present disclosure.

In some exemplary implementation modes, as shown in FIG. 5, a shape of the infrared light emission unit 304 may be consistent with a shape of an OLED display sub-pixel, may also be a very narrow strip shape (not exemplarily drawn in the figure) spanning two or more display sub-pixels, or another shape such as a square, a circle, a rectangle, a rhombus, a hexagon, or an ellipse, may be used, and if it is consistent with a shape of sub-pixels of the display unit, a part of manufacturing processes may be simplified.

In other exemplary implementation modes, the infrared light emission unit 304 may also include multiple infrared LED devices, for example, infrared Mini-LED or infrared Micro-LED devices are used, and corresponding display units may be Mini-LED or Micro-LED devices, in this way, a manufacturing process of a whole display apparatus may be kept consistent, which simplifies the processes.

In other exemplary implementation modes, as shown in FIGS. 7, 8, 9, and 10, the infrared light receiving unit 305 includes multiple infrared organic photosensitive devices, wherein an infrared organic photosensitive device includes a reflective electrode layer 701, a hole transport layer 702, a near-infrared light active layer 703, an electron transport layer 704, and a transparent electrode layer 705 that are sequentially disposed on the base substrate 600.

In this embodiment, for the infrared light receiving unit 305, an infrared organic photosensitive device structure is used, the infrared organic photosensitive device may be provided in a photosensitive region immediately adjacent to an outer side (i.e., a side away from the effective display region 100) of the infrared light emission unit 304, and an infrared light shielding wall 307 is formed between the infrared light receiving unit 305 and the infrared light emission unit 304 to prevent infrared light emitted by the inner infrared light emission unit 304 from interfering with the outer infrared light receiving unit 305.

Figure 10:
FIG. 10 is a schematic diagram of a structure of an infrared light receiving unit according to an exemplary embodiment of the present disclosure.

In some exemplary implementation modes, as shown in FIG. 10, a structure of an infrared organic photosensitive device is similar to an OLED device structure of a display unit, and the structure of the infrared organic photosensitive device may include a reflective electrode layer 701, a hole transport layer 702, a near-infrared light active layer 703, an electron transport layer 704, and a transparent electrode layer 705. Therefore, for the infrared light receiving unit 305 using this structure, its manufacturing process may be kept the same as that of a Near-Infrared light Organic Light Emitting Diode (NIR-OLED) device and an OLED device structure, for example, it is prepared using a vacuum thermal evaporation method, an ink-jet printing method, a laser thermal transfer printing method, or the like. A working principle of the infrared light receiving unit 305 is that when irradiated by infrared light of a certain frequency, the near-infrared light active layer 703 in the middle is excited to generate electrons and holes, and a current is formed under an action of a certain bias voltage applied at two ends of a device, and finally an infrared light signal is converted into an electrical signal.

In other exemplary implementation modes, the infrared light receiving unit 305 may include multiple infrared silicon-based photosensitive devices. In this embodiment, an infrared silicon-based photosensitive device is used for a structure of the infrared light receiving unit 305, and the display units may be Mini-LEDs or Micro-LEDs, in this way, a manufacturing process of an entire display apparatus may be kept consistent, for example, a huge amount transfer mode is used.

In some exemplary implementation modes, an infrared light filter layer 405 may be provided on a side of the infrared light receiving unit 305 away from the base substrate 600 to filter out other stray light in an external environment and retain only an infrared light component to improve a modulation bandwidth, while other regions are transparent film layers, and a display effect of the effective display region is not affected.

Figure 9:
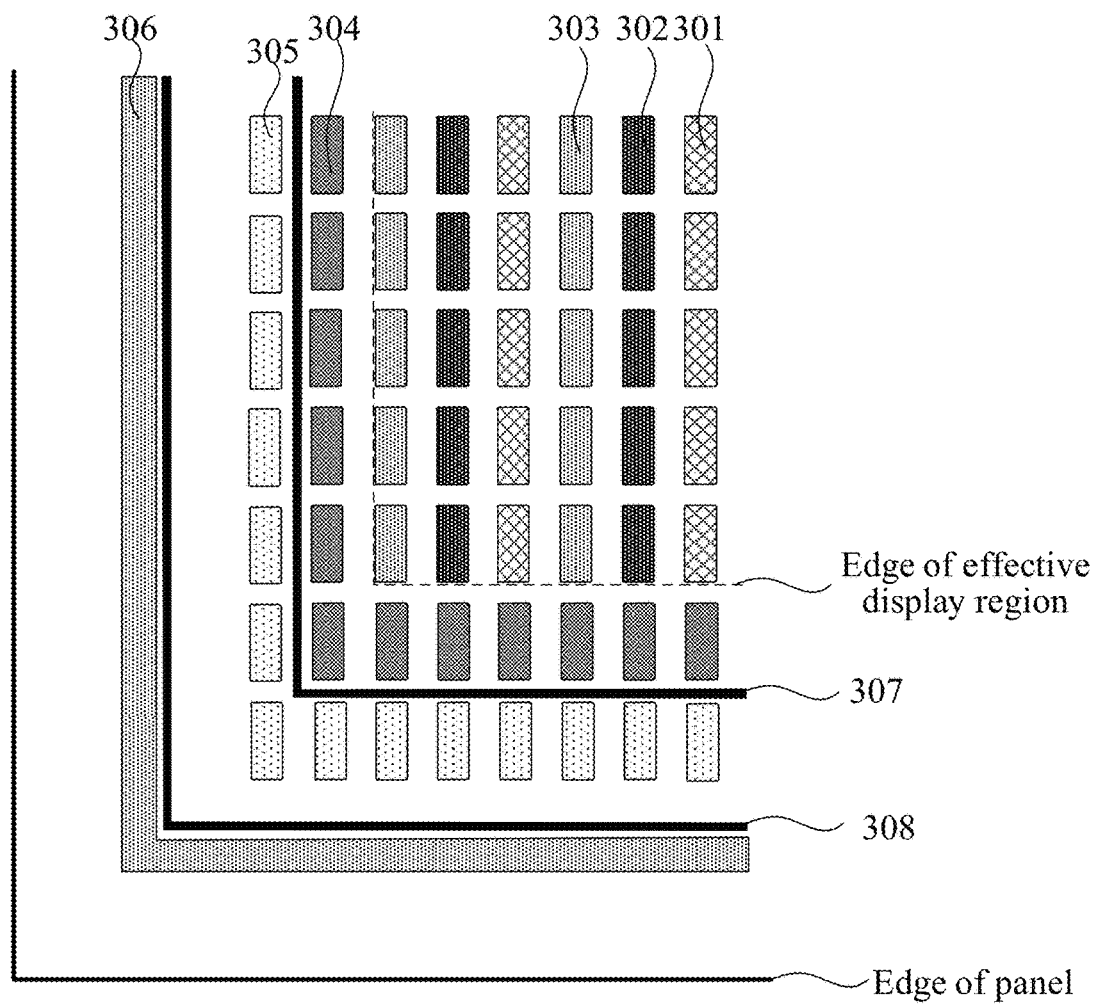
FIG. 9 is a cross-sectional view of a lower left corner region of the display substrate in FIG. 7.

In some exemplary implementation modes, as shown in FIG. 9, a shape of the infrared light receiving unit 305 may be consistent with a shape of an OLED display sub-pixel, may also be a very narrow strip shape spanning two or more display sub-pixels, or another shape may be used, such as a square, a circle, a rectangle, a rhombus, a hexagon, or an ellipse, and when the shape of the infrared light receiving unit 305 is consistent with a shape of a sub-pixel of a display unit, a part of manufacturing processes may be simplified.

Figure 11:
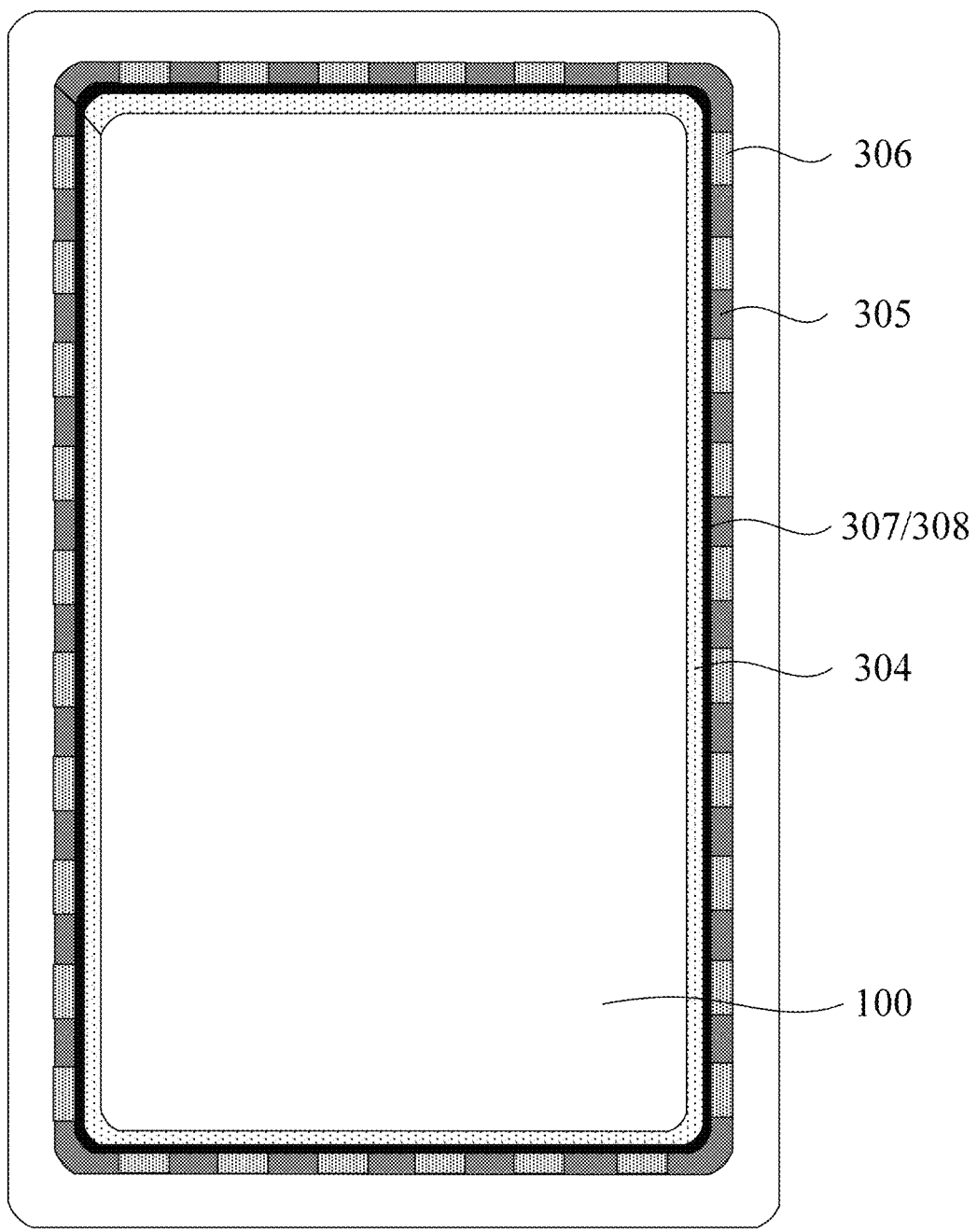
FIG. 11 is a schematic diagram of a structure of another display substrate according to an exemplary embodiment of the present disclosure.
Figure 12:
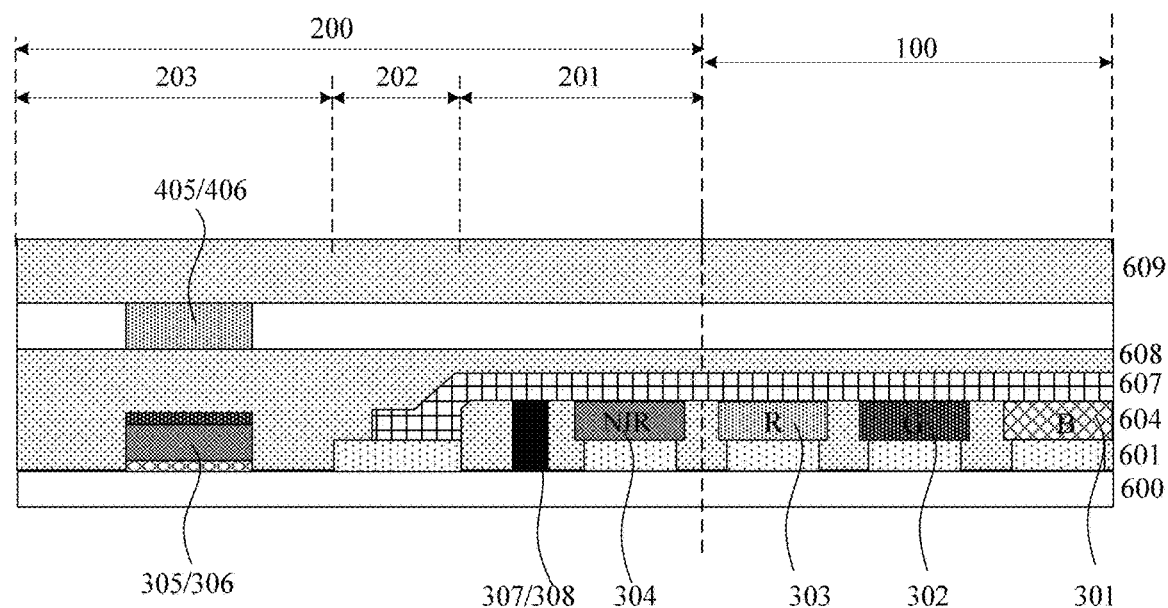
FIG. 12 is a cross-sectional view of the display substrate in FIG. 11.
Figure 13A:
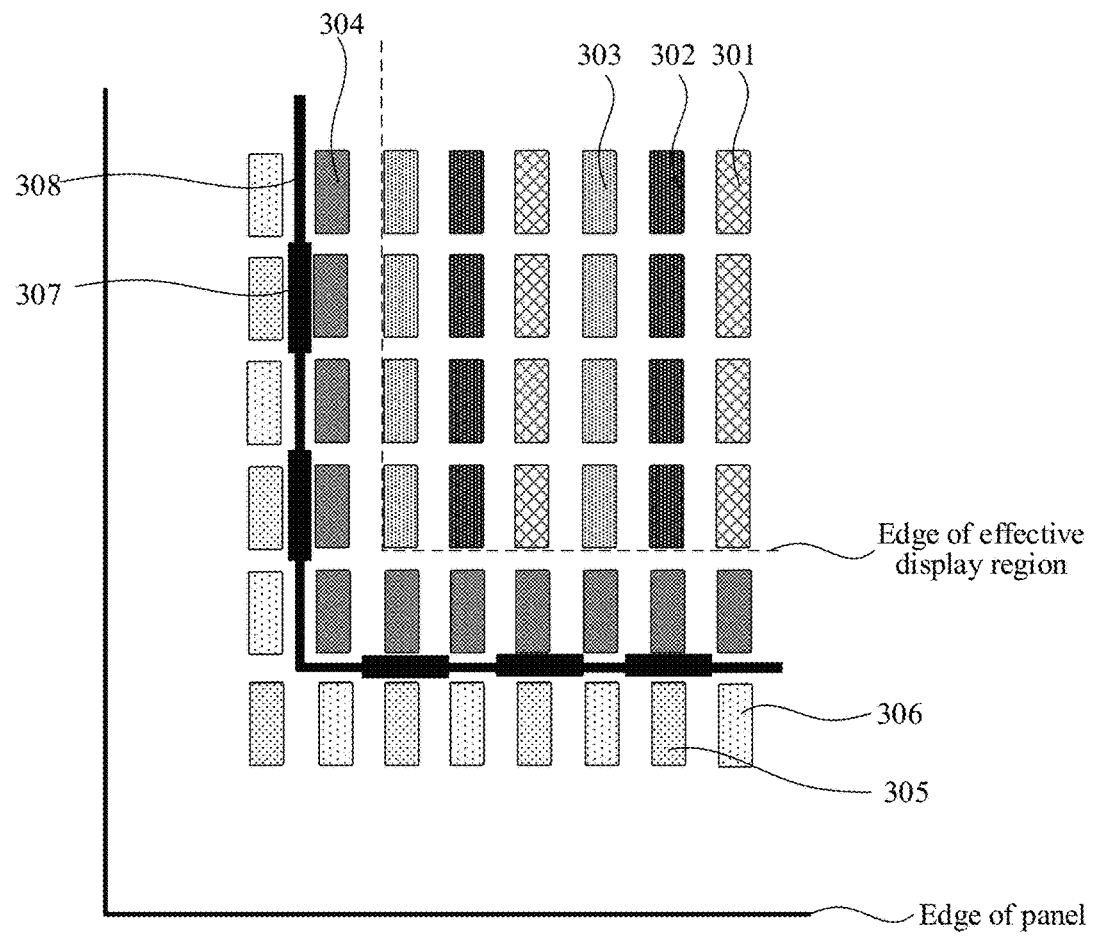
FIG. 13a is a cross-sectional view of a lower left corner region of the display substrate in FIG. 11.

In other exemplary implementation modes, as shown in FIGS. 11, 12, and 13a, the infrared light receiving unit 305 may include multiple infrared organic photosensitive devices, the visible light receiving unit 306 may include multiple visible light organic photosensitive devices, multiple infrared organic photosensitive devices and multiple visible light organic photosensitive devices are disposed around the effective display region 100, and one or more infrared organic photosensitive devices and one or more visible light organic photosensitive devices are alternately arranged.

In some exemplary implementation modes, an infrared light shielding wall 307 is disposed between the infrared organic photosensitive devices and the infrared light emission unit 304, and a visible light shielding wall 308 is disposed between the visible light organic photosensitive devices and the infrared light emission unit 304.

In this embodiment, an organic photosensitive device structure is used for both the visible light receiving unit 306 and the infrared light receiving unit 305, both of which are disposed in a same photosensitive region immediately adjacent to an outer side of the infrared light emission unit 304, but they are arranged alternately. At the same time, a visible light shielding wall 308 and an infrared light shielding wall 307 are alternately manufactured between a photosensitive sensing region (i.e., a region where an infrared organic photosensitive device and a visible light organic photosensitive device are located) and an infrared light emission region (i.e., a region where the infrared light emission unit 304 is located), respectively, to prevent interference of inner light on the photosensitive sensing region.

Figure 14:
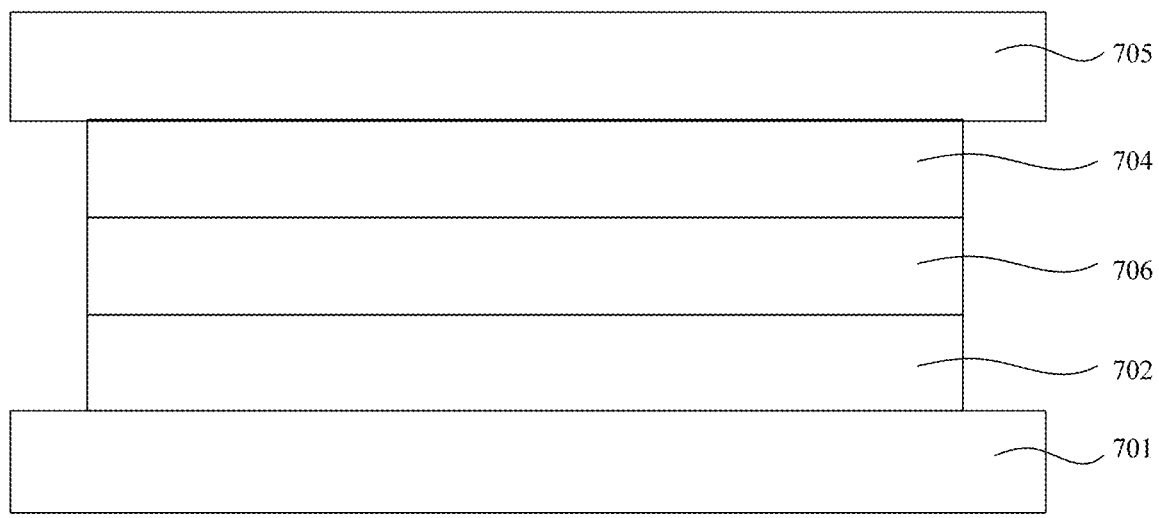
FIG. 14 is a schematic diagram of a structure of a visible light receiving unit according to an exemplary embodiment of the present disclosure.

In some exemplary implementation modes, as shown in FIG. 14, the visible light organic photosensitive device includes a reflective electrode layer 701, a hole transport layer 702, a visible light active layer 706, an electron transport layer 704, and a transparent electrode layer 705 that are sequentially disposed on the base substrate 600.

In this embodiment, a structure of the visible light organic photosensitive device is consistent with that of the infrared organic photosensitive device, as shown in FIG. 14, the structure of the visible light organic photosensitive device includes a reflective electrode layer 701, a hole transport layer 702, a visible light active layer (such as blue light) 706, an electron transport layer 704, and a transparent electrode layer 705. A difference between the visible light active layer 706 and the near-infrared light active layer 703 is that they have different sensitivities to light of different wavelengths. Therefore, with such design for structure, not only a design of a visible light photosensitive sensing region and an infrared light photosensitive sensing region is more concentrated and occupies less space, it is easy to achieve narrow bezel display, but also in a manufacturing process, a visible light organic photosensitive device, an infrared organic photosensitive device, a Near-Infrared light Organic Light Emitting Diode (NIR-OLED) device, and an OLED display unit device may be kept consistent, for example, they are prepared using a vacuum thermal evaporation method, an ink-jet printing method, a laser thermal transfer printing method, and the like.

In some exemplary implementation modes, as shown in FIG. 12, a visible light organic photosensitive device and an infrared organic photosensitive device are disposed in a same photosensitive region, shapes of the two types of photosensitive devices may be consistent with a shape of an OLED display sub-pixel, which may also be a very narrow strip shape spanning two or more display sub-pixels, or other shapes, such as a square, a circle, a rectangle, a rhombus, a hexagon, or an ellipse, may be used. When a shape of the visible light organic photosensitive device and a shape of the infrared organic photosensitive device are kept consistent with a shape of a sub-pixel of a display unit, a part of manufacturing processes may be simplified.

In other exemplary implementation modes, the visible light receiving unit 306 may include multiple visible light silicon-based photosensitive devices and the infrared light receiving unit 305 may include multiple infrared silicon-based photosensitive devices. In this embodiment, a silicon-based sensing device is used for structures of both the visible light receiving unit 306 and the infrared light receiving unit 305, and the display units may be Mini-LEDs or Micro-LEDs, in this way, a manufacturing process of an entire display apparatus may be kept consistent, for example, a huge amount transfer mode is adopted.

In some exemplary implementation modes, the infrared light filter layer 405 may be provided on a side of the infrared light receiving unit 305 away from the base substrate 600, and a visible light (blue light) filter layer 406 may be provided on a side of the visible light receiving unit 306 away from the base substrate 600. In this embodiment, the infrared light filter layer 405 and the visible light (blue light) filter layer 406 are provided above the infrared light receiving unit 305 and above the visible light receiving unit 306, respectively. The two filter layers are arranged alternately in accordance with receiving units below, respectively for filtering out unnecessary light and retaining required infrared light and visible light (blue light) components to improve a modulation bandwidth, while other regions are transparent film layers, which do not affect a display effect of the effective display region 100.

In some exemplary implementation modes, the visible light receiving unit 306 is connected to a visible light photosensitive drive unit on the thin film transistor base substrate, and the infrared light receiving unit 305 is connected to an infrared light photosensitive drive unit on the thin film transistor base substrate, and each of the visible light receiving unit and the infrared light receiving unit respectively control a certain bias voltage by driving and respectively output a current.

Figure 13B:
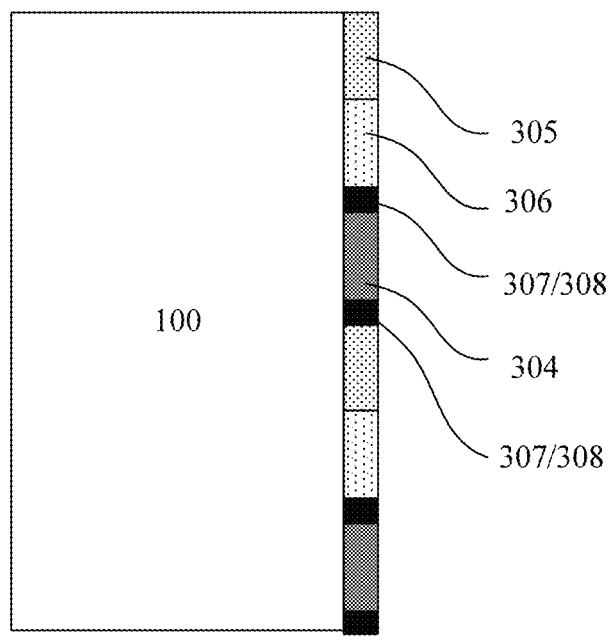
FIG. 13b is a schematic diagram of a structure of another display substrate according to an exemplary embodiment of the present disclosure.

In other exemplary implementation modes, as shown in FIG. 13b, the infrared light receiving unit 305 includes multiple infrared organic photosensitive devices, the visible light receiving unit 306 includes multiple visible light organic photosensitive devices, a light emission unit includes multiple light emission devices, and the multiple infrared organic photosensitive devices, the multiple visible light organic photosensitive devices, and the multiple light emission devices are disposed around the effective display region 100, and one or more infrared organic photosensitive devices, one or more visible light organic photosensitive devices, and one or more light emission devices are alternately arranged. Light shielding walls are provided between the light emission devices and the infrared organic photosensitive devices and between the light emission devices and the visible light organic photosensitive devices.

In this embodiment, the visible light organic photosensitive devices, the infrared organic photosensitive devices, and the light emission devices are alternately arranged, and a light shielding wall is provided between the light emission devices and two types of photosensitive devices. Manufacturing processes of the light emission devices and the photosensitive devices may refer to the aforementioned solution. According to this embodiment, a width of a bezel may be further reduced, an integration effect may be improved, and a process cost is not increased. The solution of alternate arrangement is not limited to strict 1:1:1 alternation, and a quantity and an arrangement mode of various units alternately arranged may also be adjusted according to process requirements or design requirements to achieve a better use effect.

Figure 15:
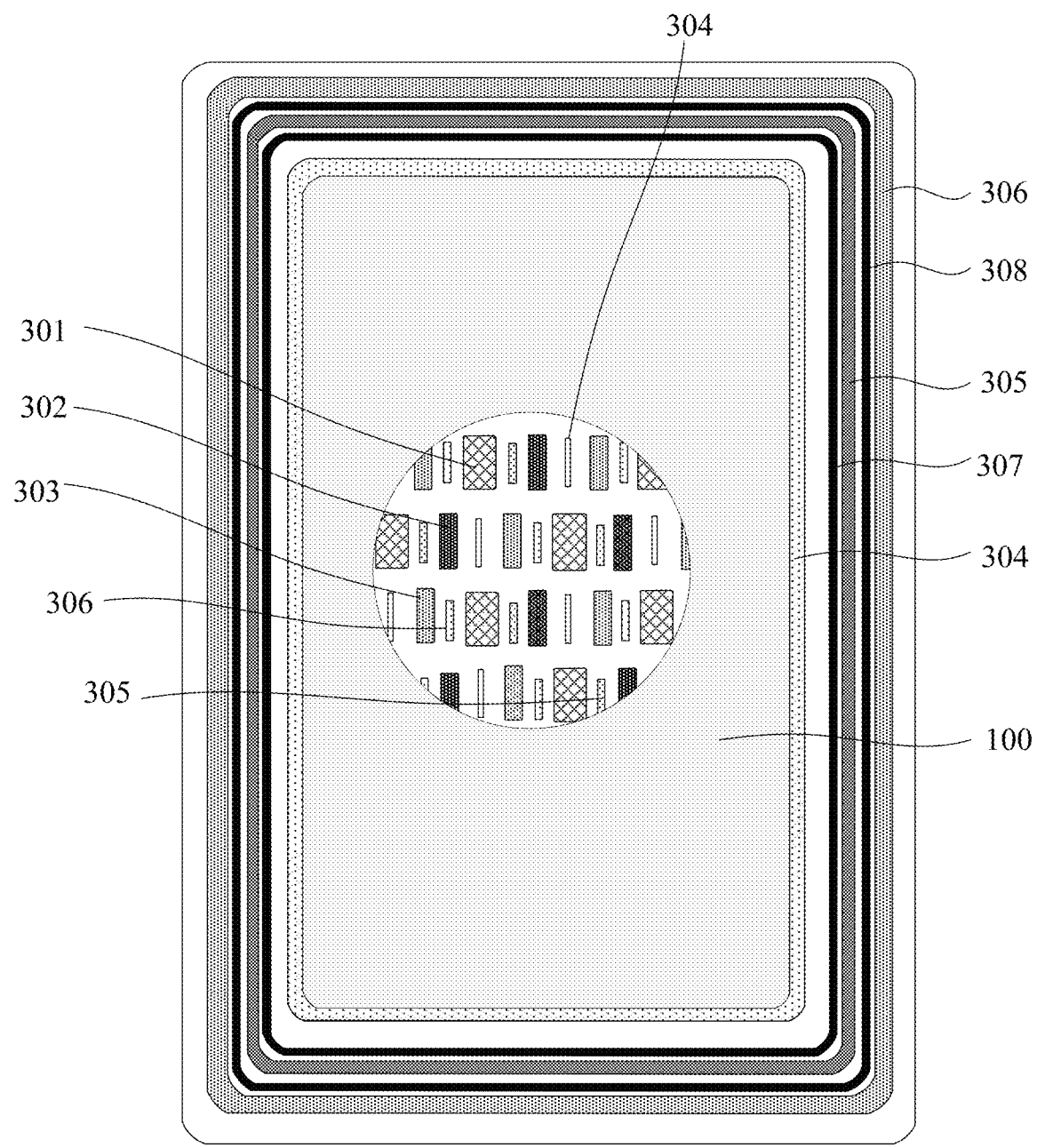
FIG. 15 is a schematic diagram of a structure of another display substrate according to an exemplary embodiment of the present disclosure.

In some exemplary implementation modes, as shown in FIG. 15, the infrared light receiving unit 305, the visible light receiving unit 306, and the light emission unit are disposed among multiple sub-pixels of the effective display region 100.

In some exemplary implementation modes, multiple light emitting sub-pixels include a red light sub-pixel 303, a green light sub-pixel 302, and a blue light sub-pixel 301, and a red light sub-pixel 303, a green light sub-pixel 302, and a blue light sub-pixel 301 that are adjacent are arranged in a triangular configuration.

In a second light transceiving region, a light emission unit(s) (which may be the infrared light emission unit 304, a visible light emission unit, or both) is located between two adjacent light emitting sub-pixels, the visible light receiving unit 306 is located between two adjacent light emitting sub-pixels, the infrared light receiving unit 305 is located between two adjacent light emitting sub-pixels, and a light emission unit, a visible light receiving unit 306, and an infrared light receiving unit 305 that are adjacent are arranged in a triangular configuration.

In this embodiment, sub-pixels of a light receiving unit, a light emission unit, and the display unit within the effective display region 100 are rearranged and redesigned (as shown in FIGS. 15-19), according to different pixel arrangement modes, different arrangement modes of transceiving units are designed, so that the visible light receiving unit 306, the infrared light receiving unit 305, and the light emission unit are arranged at intervals or in parallel, and the three units are independent of each other and do not affect each other under an action of independent driving and a light shielding wall. The light receiving units and the light emission units are provided inside the effective display region 100, thereby greatly increasing areas for receiving and emission regions and increasing a communication rate.

In some exemplary implementation modes, a PIN or heterojunction structure may be used for both the visible light receiving unit 306 and the infrared light receiving unit 305, both the visible light receiving unit 306 and the infrared light receiving unit 305 have similar manufacturing processes, by adjusting the process, peak absorption wavelengths of two devices at visible light (such as blue light) and near-infrared light may be respectively adjusted by adjusting processes. A manufacturing process is simple and may be completed in a process of manufacturing a thin film transistor. This process is highly compatible with a manufacturing process of a thin film transistor base substrate.

Figure 17:
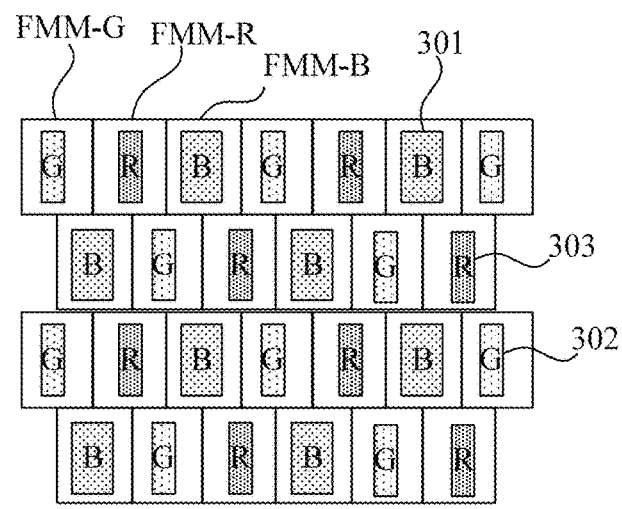
FIG. 17 is a schematic structural diagram of an arrangement of three light emitting sub-pixels of RGB.

In some exemplary implementation modes, a Near-Infrared light Organic Light Emitting Diode (NIR-OLED) device structure may be used for the infrared light emission unit 304, and a Fine Metal Mask (FMM) technology may be used during manufacturing, which is kept consistent with a manufacturing process of an OLED display unit. For an RGB-type OLED display device, three fine metal masks are used in a manufacturing process. As shown in FIG. 17, R-FMM, G-FMM, and B-FMM are used for manufacturing a light emitting device for three kinds of light emitting sub-pixels of red, green, and blue, and finally the effective display region 100 is formed.

In some exemplary implementation modes, multiple light emitting sub-pixels include a red light sub-pixel 303, a green light sub-pixel 302, and a blue light sub-pixel 301, and a red light sub-pixel 303, a green light sub-pixel 302, and a blue light sub-pixel 301 that are adjacent are arranged in a triangular configuration.

In a second light transceiving region, the infrared light emission unit 304 is located between two adjacent light emitting sub-pixels, the visible light receiving unit 306 is located between two adjacent light emitting sub-pixels, the infrared light receiving unit 305 is located between two adjacent light emitting sub-pixels, and an infrared light emission unit 304, a visible light receiving unit 306, and an infrared light receiving unit 305 that are adjacent are arranged in a triangular configuration.

In some exemplary implementation modes, in the second light transceiving region, an infrared light emission unit 304 is located between an adjacent red light sub-pixel 303 and green light sub-pixel 302. A visible light receiving unit 306 is located between an adjacent red light sub-pixel 303 and blue light sub-pixel 301, or located between an adjacent blue light sub-pixel 301 and green light sub-pixel 302. An infrared light receiving unit 305 is located between an adjacent blue light sub-pixel 301 and green light sub-pixel 302, or located between an adjacent red light sub-pixel 303 and blue light sub-pixel 301.

Figure 18:
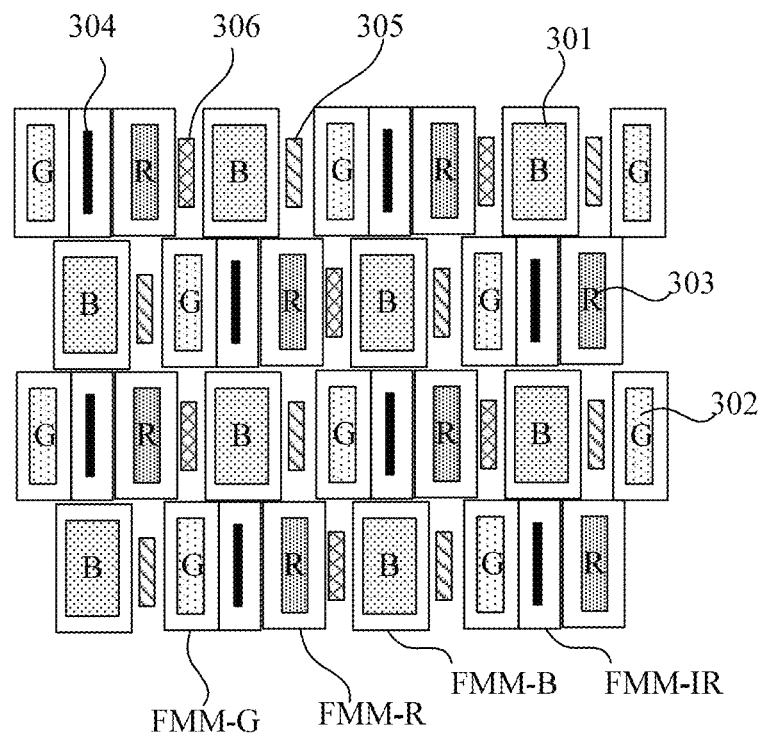
FIG. 18 is a schematic structural diagram of an arrangement of three light emitting sub-pixels of RGB and a visible light receiving unit, an infrared light receiving unit, and an infrared light emission unit according to an exemplary embodiment of the present disclosure.

As shown in FIGS. 15 and 18, taking a delta-type (i.e. triangular configuration) pixel arrangement mode as an example, three light emitting sub-pixels of red, green, and blue maintain a delta-type arrangement, and a visible light receiving unit 306, an infrared light receiving unit 305, and an infrared light emission unit 304 also maintain a delta-type arrangement. Using characteristics of a high luminous efficiency of red and green light materials, aperture ratios of red and green light sub-pixels may be kept at a low level, while blue light needs to keep a relatively large aperture ratio due to a low luminous efficiency. Therefore, when a same spacing is maintained between centerlines of three sub-pixels of red, green, and blue, a spacing between a red light sub-pixel and a green light sub-pixel is obviously larger than a spacing between a red light sub-pixel and a blue light sub-pixel and larger a spacing between a blue light sub-pixel and a green light sub-pixel. Based on this, in this embodiment, an Infrared light Organic Light Emitting Diode (IR-OLED) is provided between a red light sub-pixel and a green light sub-pixel and is maintained in a narrow and elongated shape, at the same time, between the a red light sub-pixel and a blue light sub-pixels and between a blue light sub-pixel and a green light sub-pixel, a visible light receiving unit 306 and an infrared light receiving unit 305 are manufactured respectively (manufactured using a PIN or heterojunction structure and a backplane process). Under a suitable PDL gap value and a high-precision FMM technology which may be achieved at the prior art level, adding an FMM process, namely IR-FMM, may achieve manufacturing of an IR-OLED device, and finally achieve a design solution of this embodiment.

Figure 19:
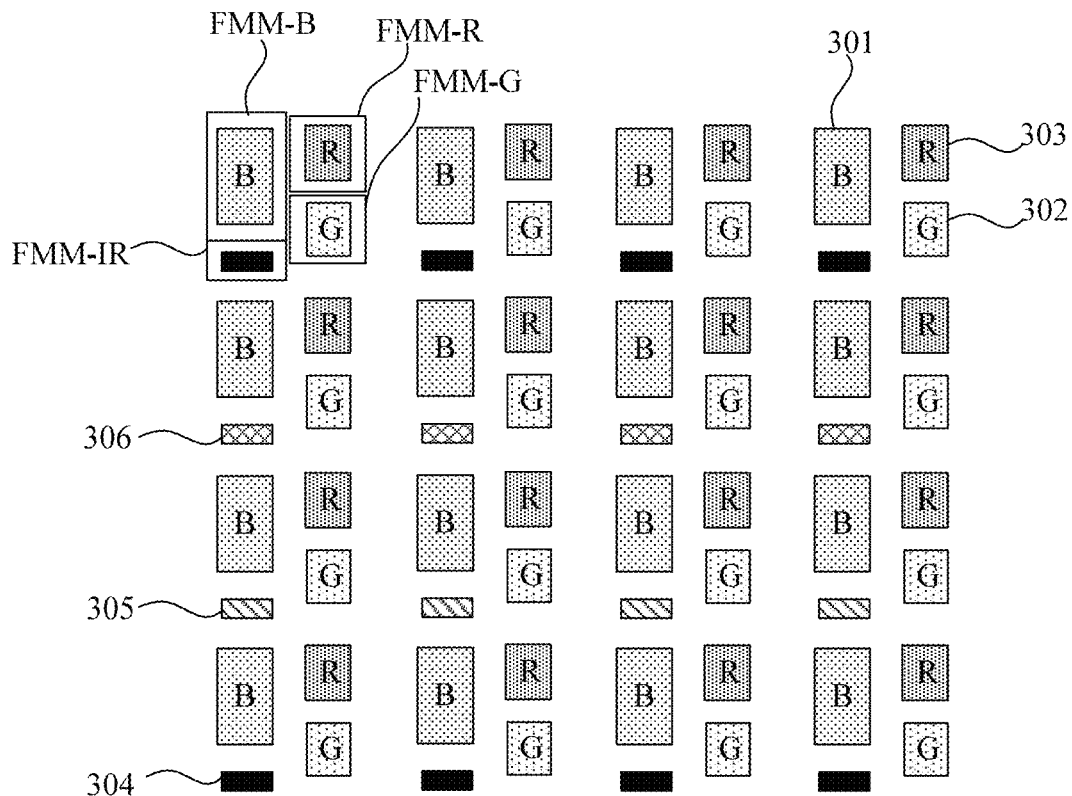
FIG. 19 is a schematic structural diagram of an arrangement of another three light emitting sub-pixels of RGB and a visible light receiving unit, an infrared light receiving unit, and an infrared light emission unit according to an exemplary embodiment of the present disclosure.

In other exemplary implementation modes, as shown in FIG. 19, taking another pixel arrangement mode as an example, blue light sub-pixels 301 are arranged in a column, and red light sub-pixels 303 and green light sub-pixels 302 are alternately arranged in a column. In this embodiment, a side-by-side arrangement mode of light receiving units and/or light emission units is designed, so that a visible light receiving unit 306, an infrared light receiving unit 305, and an infrared light emission unit 304 are kept in a side-by-side arrangement. While maintaining a relatively large blue light aperture ratio and a relatively small red-green light aperture ratio, a spacing between an upper and a lower adjacent blue light sub-pixels 301 may be made relatively large. Therefore, in this embodiment, an infrared light emission unit 304, a visible light receiving unit 306, and an infrared light receiving unit 305 are provided at positions between the upper and lower adjacent blue light sub-pixels 301. Among them, a PIN or heterojunction structure may be used for a light receiving unit, and an Infrared light Organic Light Emitting Diode (IR-OLED) device structure may be used for an infrared light emission unit 304. By adding an FMM process, namely IR-FMM, manufacturing of an IR-OLED emission device may be achieved at the prior art level, and finally a design solution of this embodiment is achieved.

In the present disclosure, a design solution in which a light emission unit and a light receiving unit are provided in the effective display region 100 is not limited to design solutions in the above embodiments, for example, the light emission unit and the light receiving unit may be provided inside a sub-pixel (including red, green, and blue trichromatic sub-pixels) of the display unit, or in a region between sub-pixels, or the like. The light emission unit and the light receiving unit disposed inside the effective display region 100 in the present disclosure may be in a shape of one or more of a square, a circle, a rectangle, a rhombus, a hexagon, an ellipse, an L-shape, a Y-shape, or the like, and may also be a very narrow strip-shaped receiving region spanning two or more sub-pixels.

Figure 16:
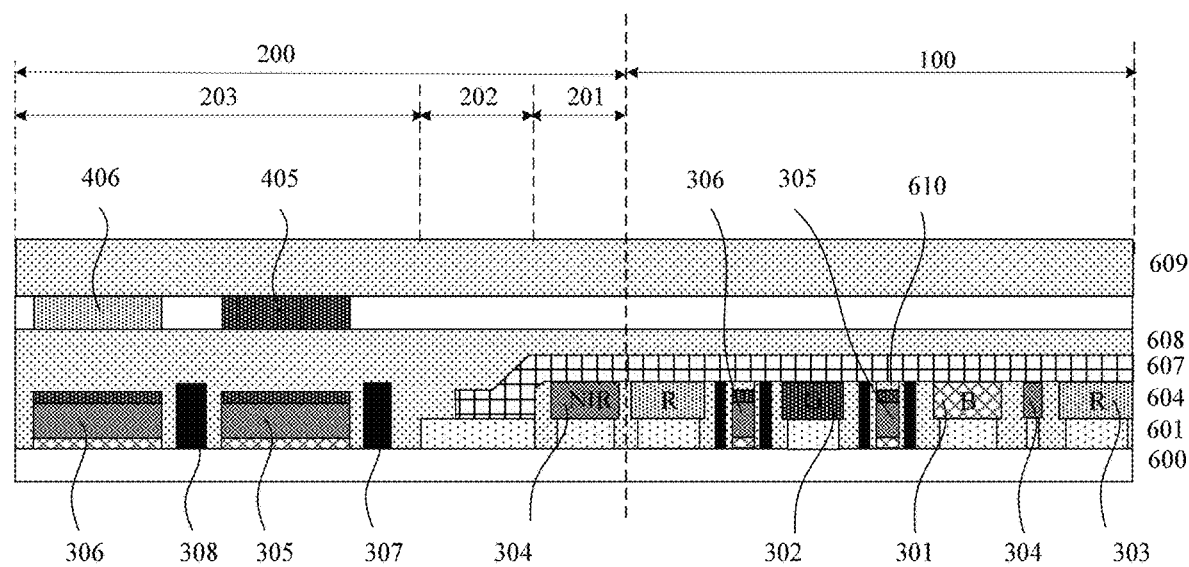
FIG. 16 is a cross-sectional view of the display substrate in FIG. 15.

In some exemplary implementation modes, as shown in FIG. 16, in the effective display region 100, a transparent insulation layer 610 is disposed between the infrared light receiving unit 305 and a cathode, and a transparent insulation layer 610 is disposed between the visible light receiving unit 306 and the cathode.

In this embodiment, a light receiving unit is disposed in the effective display region 100, and a light receiving unit device will be placed under a cathode layer of the effective display region 100. Therefore, a transparent insulation layer 610 is designed to be between a metal layer on an upper side of the light receiving unit device and the cathode layer of the effective display region 100 in this embodiment. When the light receiving unit is on an outer side of the cathode lap region 202, the encapsulation layer 608 is above it, thus there is no need to design a transparent insulation layer. The transparent insulation layer 610 may be made of an inorganic material, such as silicon nitride, silicon oxide, or silicon oxynitride, or may be made of an organic material, such as a resin material or polyimide, but it is not limited to the above materials. A material of this layer is required to be colorless and have good transmittance.

In some exemplary implementation modes, as shown in FIG. 16, in the effective display region 100, the infrared light receiving unit 305 is isolated from the sub-pixels by a light shielding wall, and the visible light receiving unit 306 is isolated from the sub-pixels through a light shielding wall.

In this embodiment, as shown in FIG. 16, for a light receiving unit provided within the effective display region 100, a light shielding wall structure needs to be provided around the light receiving unit, or a black PDL material is used without providing a light shielding wall. A material of the visible light shielding wall 308 described in the present disclosure may be a photoresist resin material for manufacturing a black matrix, and a material of the infrared light shielding wall 307 may be a reflective or absorbing infrared cut-off material, but is not limited to the above materials. A height of the light shielding wall may be equal to a height of a PDL layer or slightly higher than a height of a light receiving unit device.

In some exemplary implementation modes, an OLED device structure is used for the display unit, an Infrared light Organic Light Emitting Diode (IR-OLED) device structure is used for the infrared light emission unit 304, a PIN device structure manufactured through a backplane process may be used for the visible light receiving unit 306 and the infrared light receiving unit 305, however, it is not limited to the above structures. For example, a Mini-LED or Micro-LED device structure may also be used for the display unit and the infrared light emission unit 304, and a PIN device structure manufactured through a backplane process may be used for the visible light receiving unit 306 and the infrared light receiving unit 305 or a silicon-based photosensitive device is directly used for the visible light receiving unit 306 and the infrared light receiving unit 305.

In some other exemplary implementation modes, the infrared light emission unit 304 may include a second blue light sub-pixel (pixel-2) and an infrared light color conversion layer 407, wherein the second blue light sub-pixel (pixel-2) is configured to emit blue visible light and the infrared light color conversion layer 407 is configured to convert one blue visible photon into two near-infrared photons through near-infrared quantum tailoring.

Quantum tailoring, also known as energy down-conversion, refers to a physical process in which a fluorescent luminescent material absorbs one high-energy photon and then emits two or more low-energy photons. In this process, since a quantity of photons emitted by a system is greater than a quantity of electrons absorbed by it, it is possible to achieve luminescence with a quantum efficiency greater than 1 in theory. Near-infrared quantum tailoring refers to converting one visible photon into two near-infrared photons, in this way, these two near-infrared photons may be fully utilized, and an energy loss in a process of converting visible light into photons with lower energy may be avoided.

For three kinds of light emitting pixel units of blue, green, and red in a display screen, blue light has a largest photon capacity, green light is the second, red light has smallest photon energy, and near-infrared light has a spectrum with lower energy. In the present disclosure, an infrared light color conversion layer 407 is disposed on a blue light sub-pixel, that is, to use blue light with high photon energy to excite photon transitions in a color conversion layer material (rare earth doped system material) and generate more low-energy infrared light photons. At present, only high-energy blue-violet light can excite to generate low-energy red light or near-infrared light, while green light has a relatively low capacity and is not capable of exciting low-energy light. In the present disclosure, a suitable color conversion material is selected, such as a rare earth doped system material, such down-conversion light-emitting may be achieved, with a higher quantum efficiency.

In order to further highly integrate light communication and a display technology, in this embodiment, a brand-new pixel structure design is performed, this pixel structure design is different from a current display pixel structure design. In this embodiment, red, green, and blue light emitting sub-pixels, the infrared light emission unit 304, the visible light receiving unit 306, and the infrared light receiving unit 305 are rearranged and redesigned, and a device structure of the infrared light emission unit 304 is innovatively designed, this design solution not only further simplifies a manufacturing process, omits an IR-FMM mask, and reduces a production cost, but also reduces an FMM technical difficulty of other light emitting sub-pixels, and finally makes a display apparatus with a two-way light wave communication function easier to achieve in an overall manufacturing process.

In some exemplary implementation modes, the blue light sub-pixels 301 include a first blue light sub-pixel (Pixel-1) and a third blue light sub-pixel (Pixel-3), and the infrared light emission unit 304 includes a second blue light sub-pixel (Pixel-2) and an infrared light color conversion layer 407, wherein the infrared light color conversion layer 407 is configured to convert blue visible photons emitted by the second blue light sub-pixel (Pixel-2) into near-infrared photons through near-infrared quantum tailoring.

Figure 20:
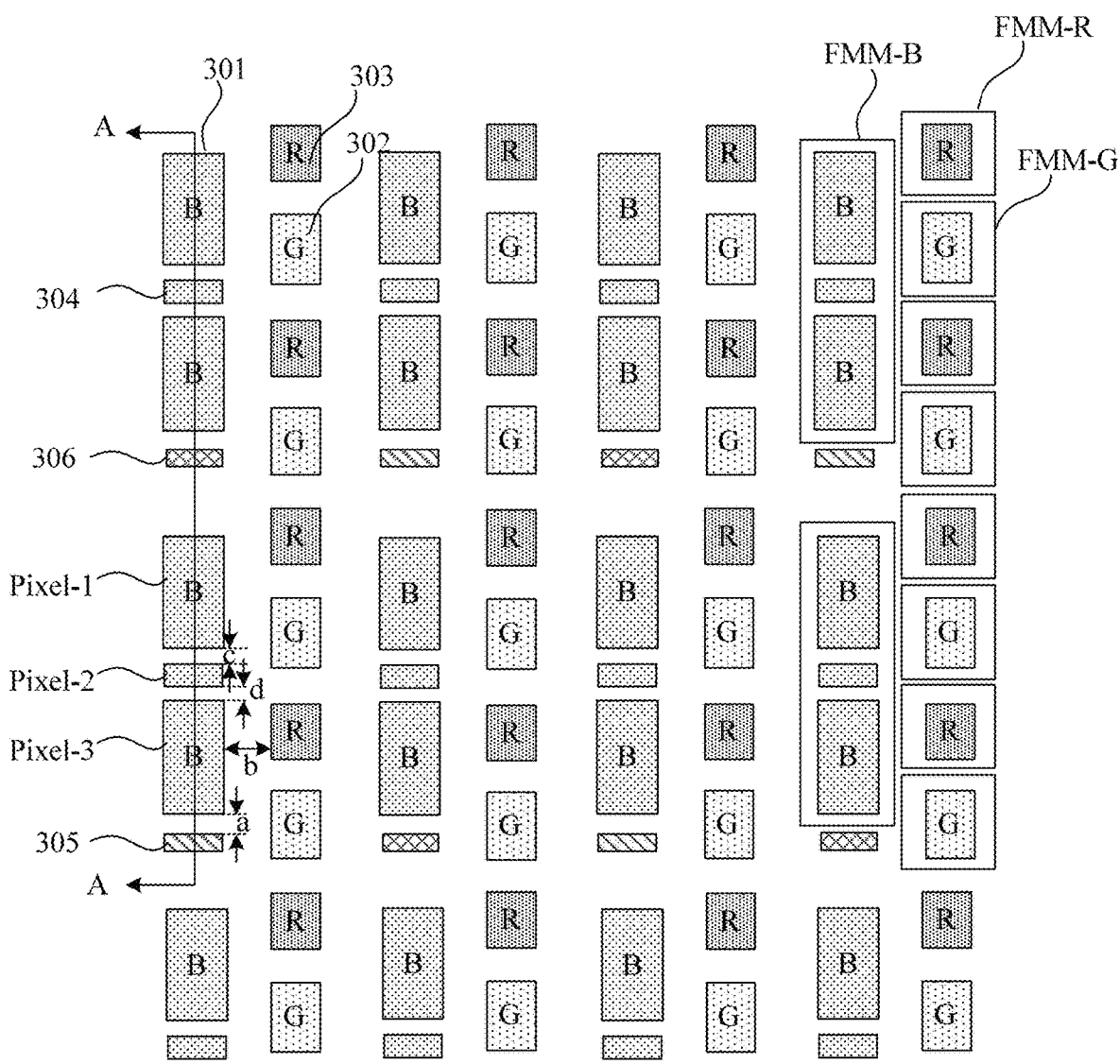
FIG. 20 is a schematic structural diagram of an arrangement of another three light emitting sub-pixels of RGB and a visible light receiving unit, an infrared light receiving unit, and an infrared light emission unit according to an exemplary embodiment of the present disclosure.
Figure 21:
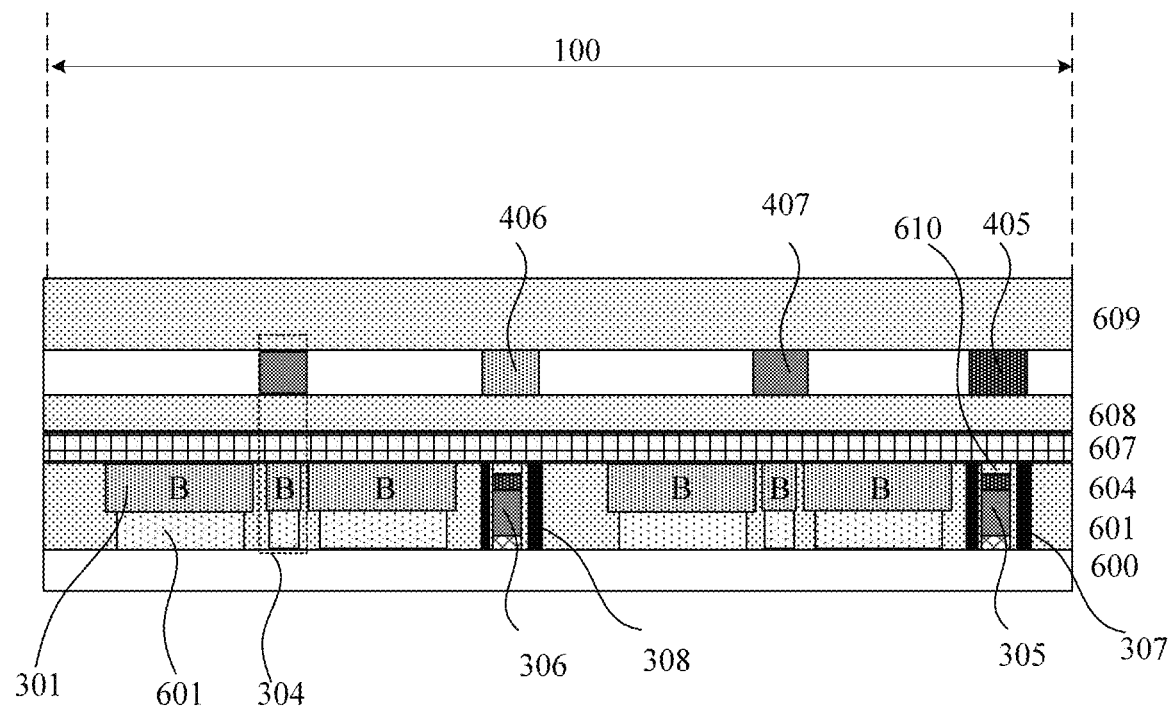
FIG. 21 is a cross-sectional view of an AA position in FIG. 20.
Figure 23:
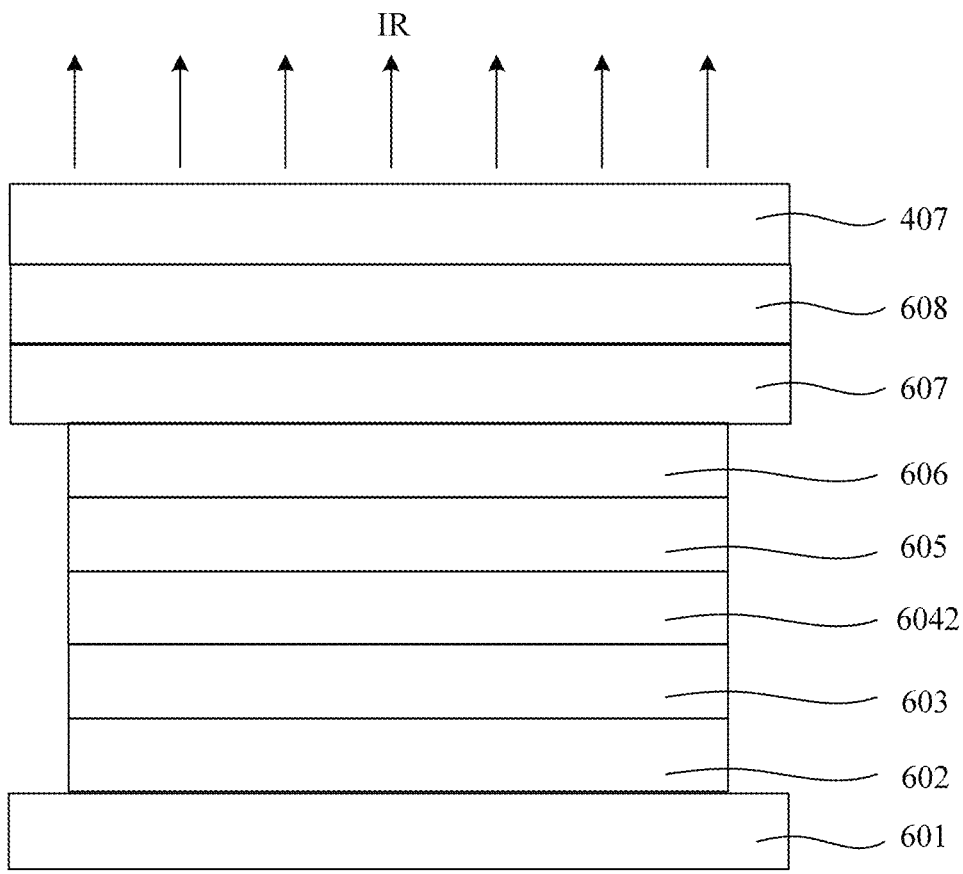
FIG. 23 is a schematic diagram of a structure of another infrared light emission unit according to an exemplary embodiment of the present disclosure.

As shown in FIGS. 20 and 21, red, green, and blue sub-pixels are arranged in an RGB form, and a blue-light pixel unit which may be driven independently is designed between an upper and a lower adjacent blue light sub-pixels 301 to form the infrared light emission unit 304 formed subsequently. A device structure of this unit is completely consistent with that of an adjacent blue light sub-pixel 301, that is, a same OLED device structure is used. In an FMM design and a device manufacturing process, a solution of 3 in 1 FMM design is adopted, that is, three sub-pixels are placed in one FMM pixel opening (as shown in an upper right corner of FIG. 20), and three unit devices may be manufactured using one FMM-B process, which not only reduces a technical difficulty of FMM, but also saves one FMM-IR process. Meanwhile, as shown in FIG. 21 and FIG. 23, since a device structure of the infrared light emission unit 304 is a visible light blue light device structure, in this embodiment, a quantum tailoring principle is used for manufacturing an infrared light color conversion layer 407 directly above this device, efficient near-infrared quantum tailoring down-conversion light-emitting can be achieved under excitation of blue light, and finally infrared light uplink signal emission is achieved. With this design, the infrared light emission unit 304 and the blue light sub-pixel 301 may be made of a same material, and there is no need to separately select and match a hole transport material, an infrared luminescent material, an electron transport material and the like for an IR-OLED, thus not only a process is simplified and a material is saved, but also quantum tailoring helps infrared light emitting to achieve a higher quantum efficiency.

In addition, in this embodiment, a visible light receiving unit 306 and an infrared light receiving unit 305 are respectively manufactured alternately between the above-mentioned group of blue light devices and another group of longitudinally adjacent blue light devices, a photodiode structure is used for both of the visible light receiving unit 306 and the infrared light receiving unit 305, such as a PIN or a heterojunction, and are respectively used for receiving a visible light downlink signal and an infrared light downlink signal.

Through the above design solution, not only a good display effect may be achieved, but also high-speed uplink and downlink two-way light wave communication may be achieved, and a manufacturing process is simple and easy to implement.

In some exemplary implementation modes, a first blue light sub-pixel (Pixel-1), a second blue light sub-pixel (Pixel-2), and a third blue light sub-pixel (Pixel-3) are alternately disposed along a second direction, the second blue light sub-pixel (Pixel-2) is disposed between the first blue light sub-pixel (Pixel-1) and the third blue light sub-pixel (Pixel-3), and the second blue light sub-pixel (Pixel-2)

is located in a same pixel opening as the first blue light sub-pixel pixel-1 and the third blue light sub-pixel (Pixel-3).

As shown in FIG. 19, among the three kinds of RGB light emitting sub-pixels in the effective display region 100, blue light sub-pixels 301 are arranged in a column, and red light sub-pixels 303 and green light sub-pixels 302 are alternately arranged in a column for displaying a picture. In some exemplary implementation modes, an OLED device structure is used for all three kinds of light emitting sub-pixels of RGB, the OLED device structure contains an anode layer, a hole injection layer, a hole transport layer, an emitting layer, an electron transport layer, an electron injection layer, a cathode layer, and other structures that are disposed sequentially on the base substrate 600. This device structure may be prepared using a vacuum thermal evaporation method, a spin coating method, an ink-jet printing method, a laser thermal transfer printing method, and the like. The OLED device structure and a manufacturing process are not limited in the embodiment of the present disclosure.

In some exemplary implementation modes, as shown in FIG. 20, a distance c between a first blue light sub-pixel (Pixel-1) and a second blue light sub-pixel (Pixel-2) along a second direction is equal to a distance d between the second blue light sub-pixel (Pixel-2) and a third blue light sub-pixel (Pixel-3) along the second direction.

In some exemplary implementation modes, as shown in FIG. 20, the distance between the second blue light sub-pixel (Pixel-2) and the third blue light sub-pixel (Pixel-3) along the second direction is smaller than a distance between the third blue light sub-pixel (Pixel-3) and an infrared light receiving unit 305 or a visible light receiving unit 306 adjacent to the third blue light sub-pixel (Pixel-3).

In some exemplary implementation modes, as shown in FIG. 20, the distance between the first blue light sub-pixel (Pixel-1) and the second blue light sub-pixel (Pixel-2) along the second direction is less than ½ of a distance between the third blue light sub-pixel (Pixel-3) and a red light sub-pixel 303 adjacent to the third blue light sub-pixel (Pixel-3) along a first direction.

As shown in FIG. 20, an arrangement mode of three kinds of light emitting sub-pixels of red, green, and blue and infrared light emission units 304 is as follows: an infrared light emission unit 304 is disposed between two blue light sub-pixels 301 adjacent in a second direction, and multiple infrared light emission units 304 remain arranged side by side. A light emitting efficiency of blue light in each pixel unit (including three sub-pixels of red, green, and blue) is low and an aperture ratio is the largest. In this embodiment, a spacing between a first blue light sub-pixel (Pixel-1) and a third blue light sub-pixel (Pixel-3) that are vertically adjacent is reduced, and a second blue light sub-pixel (Pixel-2) is disposed between them. In some exemplary implementation modes, comparing Pixel-3 with a red light sub-pixel 303 and a green light sub-pixel 302 on a right side of the Pixel-3, a position of the Pixel-3 is closer to an upper side as a whole, so that it is convenient to arrange an infrared light receiving unit 305 under the pixel-3; comparing a first blue light sub-pixel (Pixel-1 with a red light sub-pixel 303 and a green light sub-pixel 302 on a right side of the first blue light sub-pixel (Pixel-1), a position of the first blue light sub-pixel (Pixel-1) is closer to lower middle as a whole, so that a larger space may be left between the first blue light sub-pixel (Pixel-1) and a third blue light sub-pixel (Pixel-3) to arrange a second blue light sub-pixel (Pixel-2). In some exemplary implementation modes, a spacing relationship between the above-mentioned various units is c=d<b/2≤ a, and a width of the second blue light sub-pixel (Pixel-2) is equal to a width of the first blue light sub-pixel (pixel-1) and the third blue light sub-pixel (Pixel-3).

In this embodiment, a second blue light sub-pixel pixel-2 provided between an upper and a lower adjacent blue light sub-pixels 301 serves the an infrared light emission unit 304, wherein this pixel unit is independently driven by an infrared light emission drive unit on the thin film transistor base substrate. Display pixel units of the first blue light sub-pixel (Pixel-1) and the third blue light sub-pixel (Pixel-3) are independently driven by a display drive unit on the thin film transistor base substrate.

In some exemplary implementation modes, a device structure of the infrared light emission unit 304 (Pixel-2) is completely identical to a device structure of adjacent blue light sub-pixels 301 (Pixel-1 and Pixel-3), that is, a same OLED device structure is used. Therefore, in an FMM design and a device manufacturing process, a 3 in 1 FMM design solution is adopted, that is, three pixel units are placed in one FMM pixel opening (as shown in an upper right corner of FIG. 20), and three unit devices may be manufactured using one B-FMM process, which not only reduces a technical difficulty of FMM, but also saves an IR-FMM process.

A relative positional relationship and device structures of the blue light sub-pixel 301, the infrared light emission unit 304, the visible light receiving unit 306, and the infrared light receiving unit 305 described in this embodiment are shown in FIG. 21, which is a partial A-A cross-cross-sectional view in FIG. 20.

Figure 22:
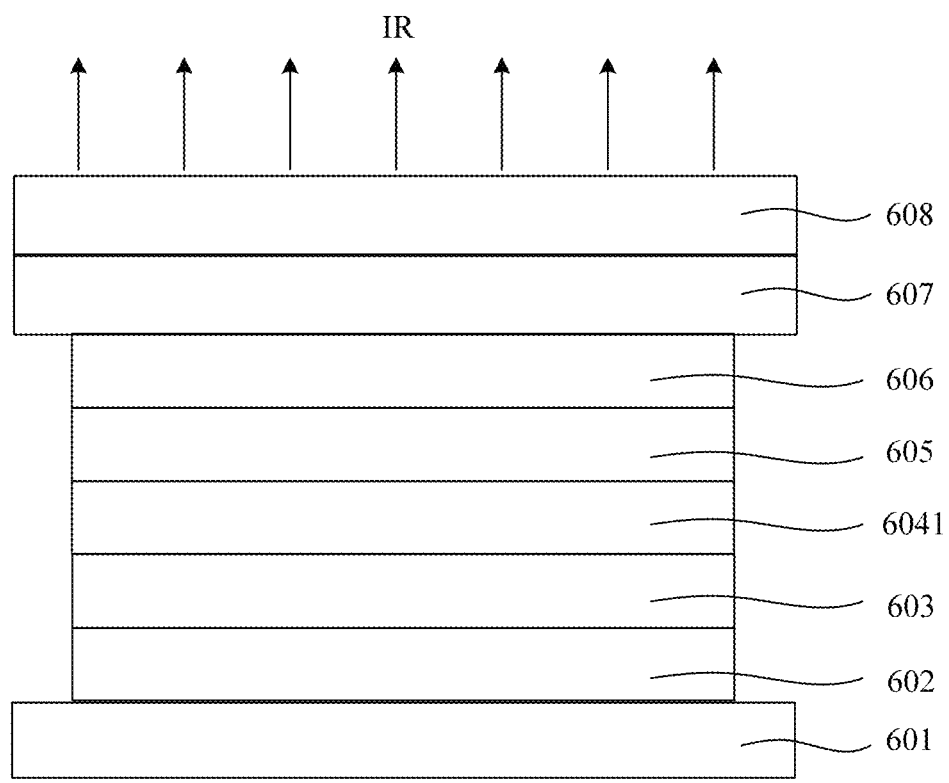
FIG. 22 is a schematic diagram of a structure of an infrared light emission unit according to an exemplary embodiment of the present disclosure.

In this embodiment, for the device structure of the infrared light emission unit 304, a conventional Infrared light Organic Light Emitting Diode (IR-OLED) device structure shown in FIG. 22 is no longer used (wherein 6041 is an Infrared Emitting Layer (IR-EML), which emits invisible near-infrared light), instead, as shown in FIG. 21 and FIG. 23, a blue light OLED device structure is manufactured in the second blue light sub-pixel (pixel-2) using a quantum tailoring principle, and an infrared light color conversion layer 407 is provided above a device. Efficient near-infrared quantum tailoring down-conversion light-emitting can be achieved under excitation of blue light, and finally infrared light uplink signal emission is achieved. With this design, the infrared light emission unit 304 and the blue light sub-pixel 301 may be made of a same material, and there is no need to separately select and match a hole transport material, an infrared luminescent material, an electron transport material and the like for an IR-OLED, not only processes is simplified and materials are saved, but also quantum tailoring helps infrared light emitting to achieve a higher quantum efficiency.

In some exemplary implementation modes, the infrared light color conversion layer 407 is disposed on the encapsulation layer 608 directly above the infrared light emission unit 304, and a material of the infrared light color conversion layer 407 may be a phosphor powder containing one or more of nitrogen, silicon, europium, lutetium, gallium, cerium and other rare earth elements, or other rare earth doped system materials, such as Tb3+/Yb3+co-doped system and Er3+/Yb3+co-doped system, which is not limited in the present disclosure.

In some exemplary implementation modes, for both the visible light receiving unit 306 and the infrared light receiving unit 305, a photodiode structure may be used, a PIN structure or a heterojunction structure may be used. The visible light receiving unit 306 and the infrared light receiving unit 305 with the above structure have a similar manufacturing process, and peak absorption wavelengths of two devices at visible light (such as blue light) and near-infrared light may be respectively adjusted by adjusting processes. The manufacturing process is simple and highly compatible with a manufacturing process of a thin film transistor base substrate.

FIG. 23 is a partial cross-sectional diagram of a display apparatus having an uplink and downlink two-way light wave communication function. As shown in FIG. 23, a display substrate includes light emitting sub-pixels of red, green, and blue, an infrared light emission unit 304, a visible light receiving unit 306, an infrared light receiving unit 305, a light filter and color conversion layer, and other structures.

In some exemplary implementation modes, when a visible light emission unit is a white fluorescent LED, for the display substrate of the embodiment of the present disclosure, a blue light filter layer 406 may be provided above the visible light receiving unit 306, to filter out yellow light in an emission end of the fluorescent LED and retain only a blue light component, an infrared light filter layer 405 may be provided above the infrared light receiving unit 305 to filter out other stray light in an external environment and retain only an infrared light component, thereby improving a communication modulation bandwidth, while other regions are transparent film layers, which do not affect a display effect of an effective display region 100, as shown in FIG. 23. In some exemplary implementation modes, a material of the blue light filter layer 406 may be a conventional organic blue light filter material, a quantum dot material, or the like, and a material of the infrared light filter layer 405 may be a black or deep red material with PC and PMMA as a base material, but is not limited to the materials listed above.

In some exemplary implementation modes, on a plane perpendicular to the display substrate, the display substrate further includes a polarizer (POL) layer 609, wherein the polarizer layer 609 is disposed on a side of a light filter layer away from a base substrate 600, or disposed between the light filter layer and an encapsulation layer 608.

In this embodiment, the light filter layer may be disposed on a side of the polarizer layer 609 away from the base substrate 600 or on a side of the polarizer layer 609 close to the base substrate 600. However, considering that a polarizer itself plays a role in filtering stray light in sunlight, a better effect is achieved if the light filter layer is disposed on the side of the polarizer layer 609 close to the base substrate 600.

In some exemplary implementation modes, as shown in FIG. 23, in the effective display region 100, a transparent insulation layer 610 is disposed between the infrared light receiving unit 305 and a cathode layer 607, and a transparent insulation layer 610 is disposed between the visible light receiving unit 306 and the cathode layer 607.

In this embodiment, a light receiving unit is disposed in the effective display region 100, and a light receiving unit device is placed under a cathode layer of the effective display region 100. Therefore, a transparent insulation layer 610 is designed to be between a metal layer on an upper side of the light receiving unit device and the cathode layer of the effective display region 100 in this embodiment. The transparent insulation layer 610 may be made of an inorganic material, such as silicon nitride, silicon oxide, or silicon oxynitride, or may be made of an organic material, such as a resin material or polyimide, but it is not limited to the above materials. This layer of material is required to be colorless and have good transmittance.

Figure 24:
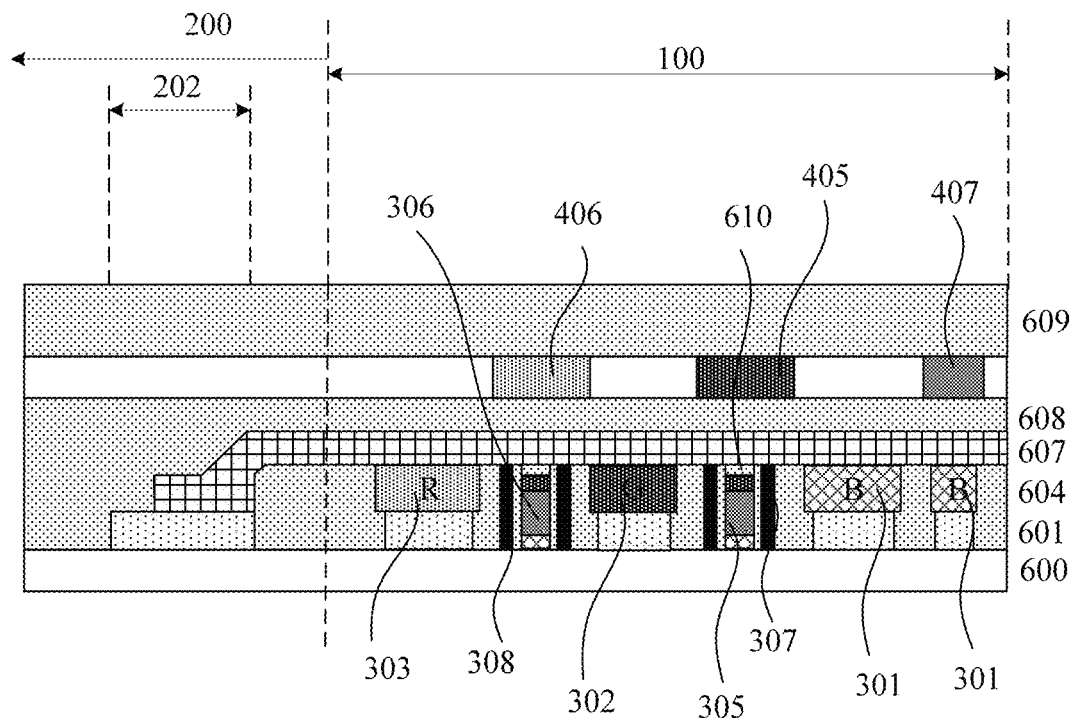
FIG. 24 is a cross-sectional view of a display substrate according to an exemplary embodiment of the present disclosure.

In some exemplary implementation modes, as shown in FIG. 24, in the effective display region 100, the infrared light receiving unit 305 is isolated from the sub-pixels through an infrared light shielding wall 307, and the visible light receiving unit 306 is isolated from the sub-pixels through a visible light shielding wall 308.

In this embodiment, as shown in FIG. 24, for a light receiving unit provided within the effective display region 100, a light shielding wall structure needs to be provided around the light receiving unit, or a black PDL material is used without providing a light shielding wall. A material of the visible light shielding wall 308 described in the present disclosure may be a photoresist resin material for manufacturing a black matrix, and a material of the infrared light shielding wall 307 may be a reflective or absorbing infrared cut-off material, but is not limited to the above materials. A height of the light shielding wall may be equal to a height of a PDL layer or slightly higher than a height of the light receiving unit device.

In some exemplary implementation modes, a visible light emission unit may be one or more light emitting sub-pixels which may be located within the effective display region.

In some exemplary implementation modes, for some display terminals, such as an industrial control display screen, there is no need to change a picture as frequently as a mobile phone or a television screen, but background light is always bright and the rest is only used for displaying numbers, etc. In this case, for a display screen, visible light may be used as a signal emission unit. A two-way light communication function is achieved in this kind of device as follows: a display screen 1 emits a visible light uplink signal through always bright background light as an emission light source, and then the visible light receiving unit 306 on a display screen 2 receives the signal. At the same time, a visible light signal emitted by a visible light emission unit on the display screen 2 may also be received by the visible light receiving unit 306 on the display screen 1, and finally two-way communication between display terminals is achieved. In the same way, between a display terminal and an illumination system, communication may also be carried out by using visible light as emission and receiving light sources, wherein the illumination system should contain a visible light photosensitive sensor.

In this embodiment, a device structure of the display screen 1 or the display screen 2 may be an LCD, an OLED, or an LED, such as a Mini-LED or a Micro-LED.

When the device structure is an LCD, an uplink signal emission unit may no longer be manufactured in the device structure, but an LCD backlight source is used as an uplink signal emission unit, and an uplink high-frequency signal is loaded in the backlight source and emit out with light of the backlight source. At the same time, the visible light receiving unit 306 needs to be manufactured in a backplane to be used for receiving an external downlink light signal and converting the light signal into an electrical signal. After decoding and post-processing, downlink communication information is presented through a display unit on an LCD screen, such as text, a picture, and a video. The visible light receiving unit 306 is manufactured on the backplane, and its layout on the backplane may be outside a display effective region or between pixels within the display effective region, which is as described in previous embodiments, and will not be repeated here.

When a display device structure is an active light emitting device such as an OLED or an LED, an uplink signal emission unit may not be designed or manufactured on the backplate, one or more of RGB light emitting sub-pixel units is directly used as an uplink signal emission unit, and an uplink high-frequency signal is loaded in a light emitting pixel unit and emitted out. For a downlink visible light photosensitive receiving unit, reference may be made to design solutions of other embodiments.

In some exemplary implementation modes, the visible light emission unit is one or more light emitting sub-pixels located within the effective display region 100 and located in an annular region close to an edge of the effective display region 100.

Figure 25:
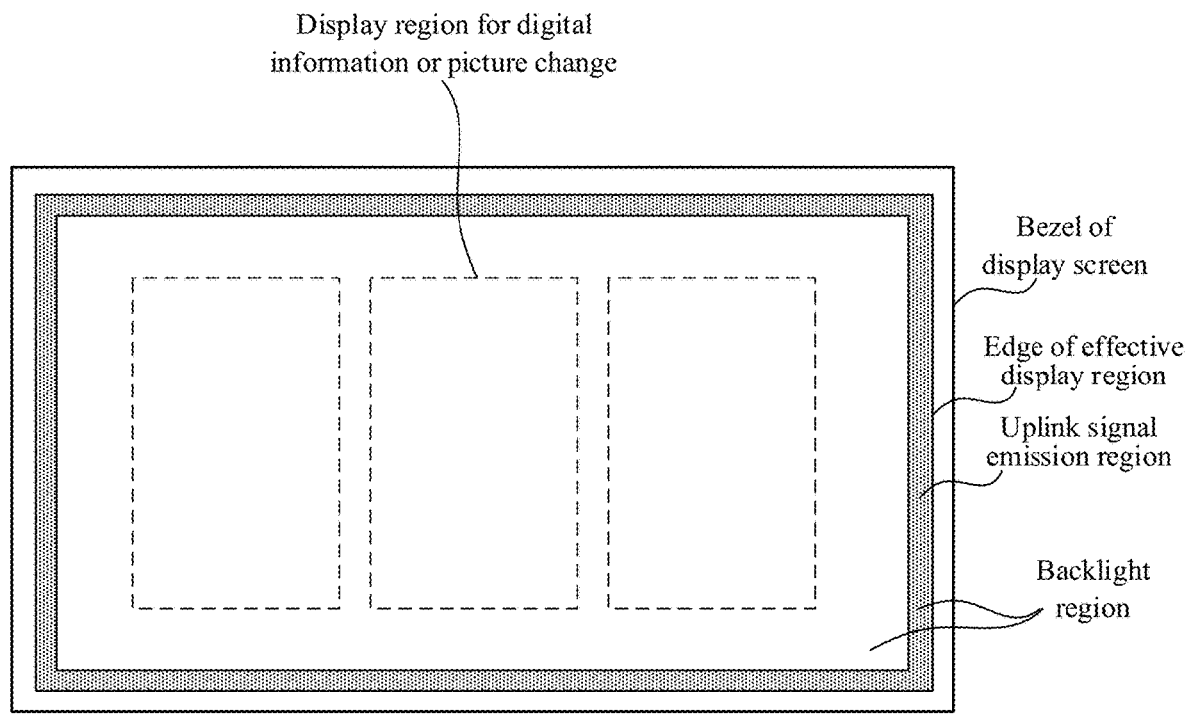
FIG. 25 is a schematic diagram of a structure of another display substrate according to an exemplary embodiment of the present disclosure.

In this embodiment, for display terminals, such as display screens used in smart home (for example, on refrigerators) or some industrial control display screens, there is no need to change a picture as frequently as a mobile phone or a TV screen, but background light is always bright, and the rest is only used for displaying numbers or pictures, etc. In a device structure design, a display pixel unit of a local region may be used as a visible light signal emission unit, that is, the display pixel may not only play a conventional role of displaying, but also serve as a signal emission unit of light communication. As shown in FIG. 25, a display pixel unit of a local region may be disposed in an annular region close to an edge within an effective display region 100 of a screen, and one or more of sub-pixels of RGB light emitting sub-pixels in this region may be used as an emission source of a light communication signal, wherein a communication signal is loaded in a light emitting signal in a high-frequency form. If background light is blue and in an always bright state, for an active light emitting device such as an OLED or an LED, a blue light sub-pixel 301 may be set as a light communication emission source, that is, a high-frequency light communication signal is loaded in a blue light signal, while for an LCD device, a light communication signal is still loaded in backlight.

In some exemplary implementation modes, the visible light emission unit is one or more light emitting sub-pixels located within the effective display region 100 and located in a corner region of the effective display region 100.

Figure 26:
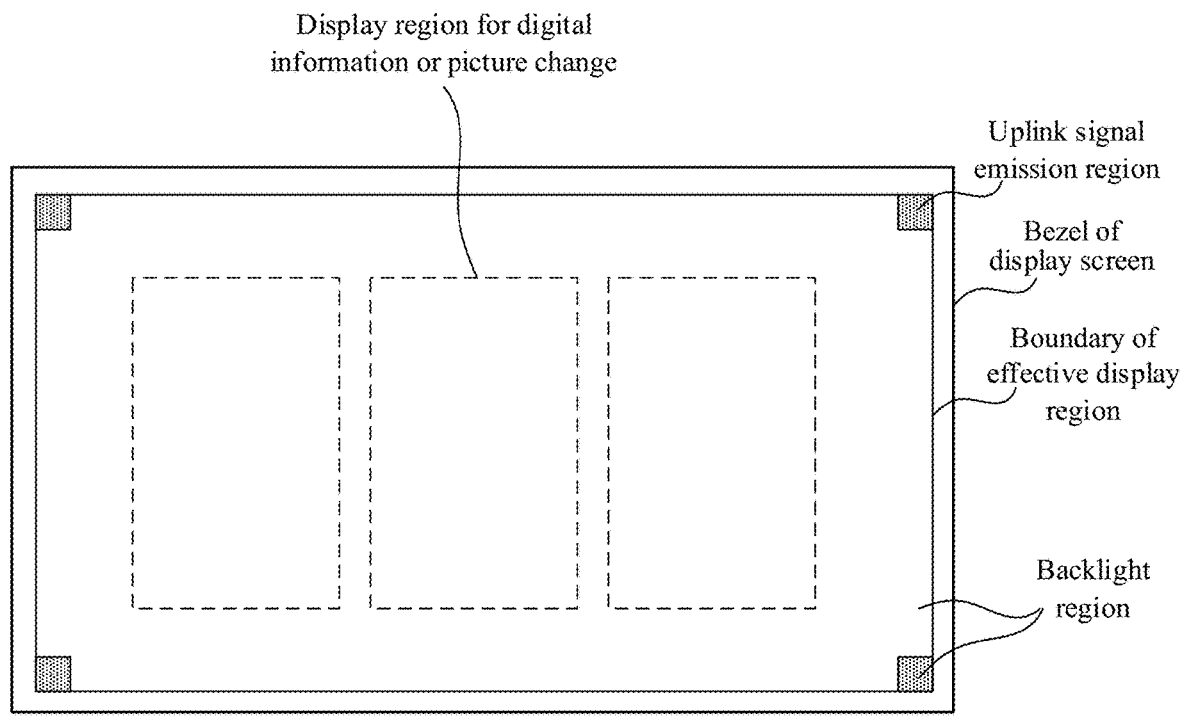
FIG. 26 is a schematic diagram of a structure of another display substrate according to an exemplary embodiment of the present disclosure.

In this embodiment, as shown in FIG. 26, a display pixel unit of a local region may also be disposed in regions of four corners within an effective display region 100 of a screen, and one or more of sub-pixels of RGB light emitting sub-pixels in such regions may be used as an emission source of a light communication signal, wherein a communication signal is loaded in a light emitting signal in a high-frequency form. The above-mentioned local region is not limited to the region shown in the figure, but may also be disposed in another region of a display screen, such as a position in a region of the always bright background light of the display screen, and the above effects may be achieved.

In some exemplary implementation modes, the visible light emission unit is one or more light emitting sub-pixels that are located within the effective display region 100 and in a display region for digitals or pictures within the effective display region 100.

Figure 27:
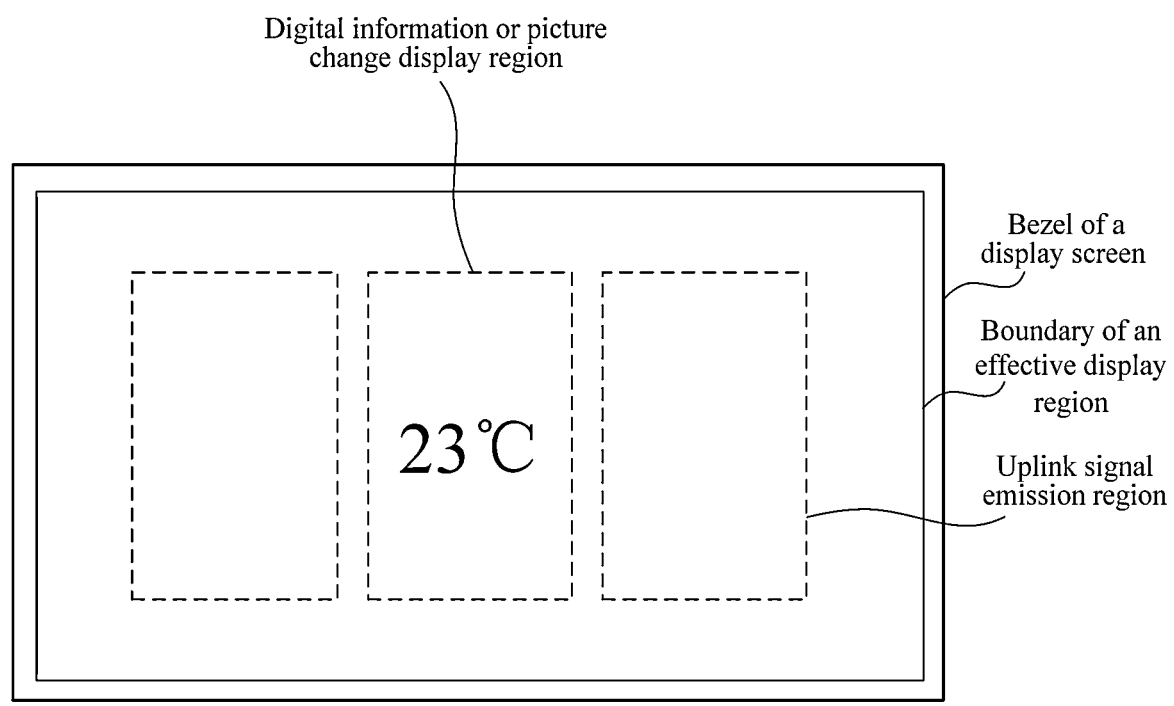
FIG. 27 is a schematic diagram of a structure of another display substrate according to an exemplary embodiment of the present disclosure.

In this embodiment, as shown in FIG. 27, for a display terminal in some application scenarios, such as a display terminal used in smart home or industrial control, it is possible that a background region is not always bright (black picture), but only in a region that needs to display a number or picture, a pixel emits light, for this case, a light emitting pixel of this region may be used as an emission source of a light communication signal, and the light emitting pixel may be one or more of RGB light emitting sub-pixels, wherein a communication signal is loaded in a light signal of a light emitting sub-pixel in a high-frequency form.

With regard to design solutions in all the above embodiments, in the present disclosure, an edge of the encapsulation region is between an outer side of an photosensitive sensing region and an edge of a display panel, including various structural designs such as a shielding wall, which are not limited in the present disclosure.

In the present disclosure, for a design solution of a light transceiving unit at a periphery of the effective display region 100 and a design solution of a light transceiving unit within the effective display region 100, the two solutions may be simultaneously adopted in a same display apparatus, or only one of the solutions may be adopted, or a combination of multiple solutions may be performed.

The present disclosure further provides a method for preparing a display substrate to prepare the display substrate provided by the above embodiment, wherein the display substrate includes an effective display region and a peripheral region surrounding the effective display region, and the preparation method includes:

forming a light device layer on a base substrate, the light device layer includes a light emitting sub-pixel, a light emission unit, and a light receiving unit, the light sub-pixel is located in the effective display region, the light emission unit is located in at least one of following: a first light transceiving region and a second light transceiving region, the light receiving unit is located in at least one of following: a first light transceiving region and a second light transceiving region, wherein the first light transceiving region is located in the peripheral region and is one or more annular regions surrounding the effective display region, and the second light transceiving region is located between multiple light emitting sub-pixels of the effective display region; the light receiving unit is configured to receive a light signal carrying communication information and convert it into an electrical signal; and the light emission unit is configured to convert an electrical signal into a light signal carrying communication information and emit the light signal.

In some exemplary implementation modes, before forming the light device layer on the base substrate, the method for preparing the display substrate may further include following steps: forming a first drive unit, a second drive unit, and a third drive unit sequentially on the base substrate, wherein the first drive unit is configured to control a pattern displayed by the light emitting sub-pixel, the second drive unit is connected to the light receiving unit and configured to control a bias voltage of the light receiving unit and output a current, and the third drive unit is connected to the light emission unit and configured to control the light signal emitted by the light emission unit.

In some exemplary implementation modes, the light emission unit includes an infrared light emission unit and/or a visible light emission unit, forming the light emitting sub-pixel and the light emission unit includes: forming an anode layer, a hole injection layer, a hole transport layer, an emitting layer, an electron transport layer, an electron injection layer, and a cathode layer sequentially on the base substrate, wherein the emitting layer includes a visible light emitting layer and an infrared light emitting layer, the visible light emitting layer emits red, green, and blue visible light, and the infrared light emitting layer emits near-infrared light.

In some exemplary implementation modes, the light emission unit includes an infrared light emission unit and/or a visible light emission unit, forming the light device layer on the base substrate includes: forming multiple infrared light emitting diodes and/or visible light emitting diodes on the base substrate.

In some exemplary implementation modes, the light receiving unit includes an infrared light receiving unit and/or a visible light receiving unit.

In some exemplary implementation modes, forming the light device layer on the base substrate includes: forming multiple visible light silicon-based photosensitive devices and multiple infrared silicon-based photosensitive devices on the base substrate.

In this embodiment, an infrared silicon-based photosensitive device is used for a structure of the infrared light receiving unit, a visible light silicon-based photosensitive device is used for a structure of the visible light receiving unit, and a display unit may be a Mini-LED or a Micro-LED, in this way, a manufacturing process of an entire display apparatus may be kept consistent, for example, a huge amount transfer mode is adopted.

In some exemplary implementation modes, forming the light device layer on the base substrate includes: forming multiple visible light organic photosensitive devices and multiple infrared organic photosensitive devices on the base substrate, a visible light organic photosensitive device includes a reflective electrode layer, a hole transport layer, a visible light active layer, an electron transport layer, and a transparent electrode layer disposed on the base substrate sequentially, an infrared organic photosensitive device includes a reflective electrode layer, a hole transport layer, a near-infrared light active layer, an electron transport layer, and a transparent electrode layer disposed on the base substrate sequentially, wherein the near-infrared light active layer is excited to generate electrons and holes when irradiated by infrared light, and the visible light active layer is excited to generate electrons and holes when irradiated by visible light.

In this embodiment, an infrared organic photosensitive device is used for a structure of the infrared light receiving unit, a visible light organic photosensitive device is used for a structure of the visible light receiving unit, manufacturing processes of the infrared light receiving unit and the visible light receiving unit using these structures may be kept the same as that of a Near-Infrared light Organic Light Emitting Diode (NIR-OLED) device and an OLED device structure, for example, they are prepared using a vacuum thermal evaporation method, an ink-jet printing method, a laser thermal transfer printing method, or the like.

In some exemplary implementation modes, forming the light device layer on the base substrate includes: forming multiple light emitting sub-pixels on the base substrate, wherein the light emitting sub-pixels include a red light sub-pixel, blue light sub-pixels, and a green light sub-pixel, wherein the blue light sub-pixels includes a first blue light sub-pixel, a second blue light sub-pixel, and a third blue light sub-pixel, and the first blue light sub-pixel, the second blue light sub-pixel, and the third blue light sub-pixel are located in a same pixel opening.

In some exemplary implementation modes, the method further includes: forming an encapsulation layer on a side of the light emitting sub-pixels away from the base substrate; forming an infrared light color conversion layer on a side of the encapsulation layer away from the base substrate, wherein an orthographic projection of the infrared light color conversion layer on the base substrate covers an orthographic projection of the second blue light sub-pixel on the base substrate, and the infrared light color conversion layer is configured to convert blue visible photons emitted by the second blue light sub-pixel into near-infrared photons through near-infrared quantum tailoring.

In some exemplary implementation modes, the method further includes: forming an encapsulation layer on a side of the light emitting sub-pixels away from the base substrate; forming a light filter layer on a side of the encapsulation layer away from the base substrate, wherein the light filter layer includes a blue light filter layer and an infrared light filter layer, an orthographic projection of the blue light filter layer on the base substrate covers an orthographic projection of the visible light receiving unit on the base substrate, and an orthographic projection of the infrared light filter layer on the base substrate covers an orthographic projection of the infrared light receiving unit on the base substrate.

In some exemplary implementation modes, the method further includes: forming a polarizer layer on a side of the light filter layer and/or the infrared light color conversion layer away from the base substrate.

For a display substrate prepared by the method for preparing the display substrate according to the present disclosure, its implementation principle and implementation effect are similar as that of the display substrate described above, and will not be repeated here.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present invention are not limited thereto.

The present disclosure further provides a display terminal which includes the aforementioned display apparatus. The display terminal in the present disclosure mainly includes a display apparatus, a motherboard, a speaker, a camera, a shell and other components. The display terminal may be a mobile phone, a computer, a tablet computer (PAD), a television, a smart home appliance display, and various other terminal devices, which are not limited here.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, comprising an effective display region and a peripheral region surrounding the effective display region, wherein the display substrate comprises a base substrate, and a display unit, a light receiving unit, and a light emission unit located on the base substrate,
   wherein the display unit is located in the effective display region and comprises a plurality of light emitting sub-pixels;
   the light receiving unit is located in at least one of following regions: a first light transceiving region and a second light transceiving region, and the light emission unit is located in at least one of following regions: a first light transceiving region and a second light transceiving region, wherein the first light transceiving region is located in the peripheral region and is one or more annular regions surrounding the effective display region, and the second light transceiving region is located between a plurality of light emitting sub-pixels of the effective display region;
   the light receiving unit is configured to receive a light signal carrying communication information and convert the light signal into an electrical signal, and the light emission unit is configured to convert an electrical signal into a light signal carrying communication information and emit the light signal.

2. The display substrate according to claim 1, wherein the light receiving unit comprises a visible light receiving unit and/or an infrared light receiving unit, the light emission unit comprises a visible light emission unit and/or an infrared light emission unit.

3. The display substrate according to claim 2, wherein the peripheral region comprises a cathode lap region, the first light transceiving region comprises a first sub-transceiving region and a second sub-transceiving region, the first sub-transceiving region is located between the cathode lap region and an edge of the display substrate, and the second sub-transceiving region is located between the cathode lap region and the effective display region.

4. The display substrate according to claim 3, wherein the infrared light emission unit is located in the second sub-transceiving region, the visible light receiving unit and the infrared light receiving unit are both located in the first sub-transceiving region, and the visible light receiving unit is located on a side of the infrared light receiving unit away from the effective display region.

5. The display substrate according to claim 4, wherein the visible light receiving unit and the infrared light receiving unit are photodiodes; or
wherein the light receiving unit is continuously disposed around the effective display region; or, the light receiving unit comprises a plurality of photosensitive devices and the plurality of photosensitive devices are dispersedly disposed around the effective display region; or
wherein on a plane perpendicular to the display substrate, the display substrate comprises the base substrate, a light device layer disposed on the base substrate, an encapsulation layer disposed on a side of the light device layer away from the base substrate, a light filter layer disposed on a side of the encapsulation layer away from the light device layer, the light device layer comprises the light emitting sub-pixels, the infrared light emission unit, the visible light receiving unit, and the infrared light receiving unit, the light filter layer comprises a blue light filter layer and an infrared light filter layer, an orthographic projection of the blue light filter layer on the base substrate covers an orthographic projection of the visible light receiving unit on the base substrate, and an orthographic projection of the infrared light filter layer on the base substrate covers an orthographic projection of the infrared light receiving unit on the base substrate.

6. The display substrate according to claim 5, further comprising a polarizer layer, wherein the polarizer layer is disposed on a side of the light filter layer away from the base substrate, or disposed between the light filter layer and the encapsulation layer.

7. The display substrate according to claim 6, wherein a visible light shielding wall is provided between the visible light receiving unit and the infrared light receiving unit, and an infrared light shielding wall is provided between the infrared light receiving unit and the cathode lap region.

8. The display substrate according to claim 5, wherein the infrared light emission unit comprises a plurality of infrared organic light emitting diodes, the light emitting sub-pixels comprise a plurality of organic light emitting diodes, and the light device layer comprises an anode layer, a hole injection layer, a hole transport layer, an emitting layer, an electron transport layer, an electron injection layer, and a cathode layer disposed on the base substrate sequentially, and the emitting layer comprises a visible light emitting layer and an infrared light emitting layer.

9. The display substrate according to claim 3, wherein the visible light receiving unit and the infrared light receiving unit are both located in the first sub-transceiving region, and the visible light receiving unit and the infrared light receiving unit are alternately arranged around the effective display region; or
the infrared light emission unit and the infrared light receiving unit are both located in the second sub-transceiving region, the visible light receiving unit is located in the first sub-transceiving region, and the infrared light receiving unit is located on a side of the infrared light emission unit away from the effective display region.

10. The display substrate according to claim 9, wherein the infrared light receiving unit comprises a plurality of infrared organic photosensitive devices, and an infrared organic photosensitive device comprises a reflective electrode layer, a hole transport layer, a near-infrared light active layer, an electron transport layer, and a transparent electrode layer that are sequentially disposed on the base substrate; or
the infrared light receiving unit comprises a plurality of infrared silicon-based photosensitive devices.

11. The display substrate according to claim 6, wherein a visible light shielding wall is provided between the visible light receiving unit and the cathode lap region, and an infrared light shielding wall is provided between the infrared light receiving unit and the infrared light emission unit.

12. The display substrate according to claim 2, wherein the visible light receiving unit comprises a plurality of visible light organic photosensitive devices, and a visible light organic photosensitive device comprises a reflective electrode layer, a hole transport layer, a visible light active layer, an electron transport layer, and a transparent electrode layer sequentially disposed on the base substrate; or
the visible light receiving unit comprises a plurality of visible light silicon-based photosensitive devices; or
the infrared light receiving unit comprises a plurality of infrared organic photosensitive devices, the visible light receiving unit comprises a plurality of visible light organic photosensitive devices, the plurality of infrared organic photosensitive devices and the plurality of visible light organic photosensitive devices are disposed around the effective display region, and one or more infrared organic photosensitive devices and one or more visible light organic photosensitive devices are alternately arranged.

13. The display substrate according to claim 12, wherein an infrared light shielding wall is provided between the infrared organic photosensitive devices and the infrared light emission unit, and a visible light shielding wall is provided between the visible light organic photosensitive devices and the infrared light emission unit.

14. The display substrate according to claim 2, wherein the infrared light receiving unit comprises a plurality of infrared organic photosensitive devices, the visible light receiving unit comprises a plurality of visible light organic photosensitive devices, the light emission unit comprises a plurality of light emission devices, the plurality of infrared organic photosensitive devices, the plurality of visible light organic photosensitive devices, and the plurality of light emission devices are disposed around the effective display region, and one or more infrared organic photosensitive devices, one or more visible light organic photosensitive devices, and one or more light emission devices are alternately arranged around the effective display region; and light shielding walls are respectively disposed between the light emission devices and the infrared organic photosensitive devices, and between the light emission devices and the visible light organic photosensitive devices;

or, the plurality of light emitting sub-pixels comprise red light sub-pixels, green light sub-pixels, and blue light sub-pixels, and a red light sub-pixel, a green light sub-pixel, and a blue light sub-pixel that are adjacent are arranged in a triangular configuration; and in the second light transceiving region, the infrared light emission unit is located between two adjacent light emitting sub-pixels, the visible light receiving unit is located between two adjacent light emitting sub-pixels, the infrared light receiving unit is located between two adjacent light emitting sub-pixels, and the infrared light emission unit, the visible light receiving unit, and the infrared light receiving unit that are adjacent are arranged in a triangular configuration.

15. The display substrate according to claim 14, wherein in the second light transceiving region, the infrared light emission unit is located between a red light sub-pixel and a green light sub-pixel that are adjacent;

the visible light receiving unit is located between a red light sub-pixel and a blue light sub-pixel that are adjacent, or located between a blue light sub-pixel and a green light sub-pixel that are adjacent; and the infrared light receiving unit is located between a blue light sub-pixel and a green light sub-pixel that are adjacent, or located between a red light sub-pixel and a blue light sub-pixel that are adjacent.

16. The display substrate according to claim 2, wherein the plurality of light emitting sub-pixels comprise red light sub-pixels, green light sub-pixels, and blue light sub-pixels, and in two columns of light emitting sub-pixels that are adjacent, red light sub-pixels and green light sub-pixels are alternately arranged along a second direction to form one column, and blue light sub-pixels form the other column;

in the second light transceiving region, a plurality of infrared light emission units, visible light receiving units, and infrared light receiving units are arranged in a plurality of rows along a first direction, and an infrared light emission unit, a visible light receiving unit, and an infrared light receiving unit are all located between two adjacent blue light sub-pixels in the second direction.

17. The display substrate according to claim 16, wherein the plurality of infrared light emission units are respectively arranged in a plurality of rows along the first direction, the plurality of visible light receiving units are respectively arranged in a plurality of rows along the first direction, the plurality of infrared light receiving units are arranged in plurality of rows along the first direction, and the infrared light emission units, the visible light receiving units, and the infrared light receiving units are alternately arranged in the second direction;

or, wherein a width of a blue light sub-pixel along the first direction is equal to a width of a red light sub-pixel along the first direction, and the width of the blue light sub-pixel along the first direction is equal to a width of a green light sub-pixel along the first direction; and a length of a blue light sub-pixel along the second direction is larger than a length of a red light sub-pixel along the second direction, the length of the blue light sub-pixel along the second direction is larger than a length of a green light sub-pixel along the second direction, and the length of the blue light sub-pixel along the second direction is smaller than a sum of the lengths of the red light sub-pixel and the green light sub-pixel along the second direction;

or, wherein in the second light transceiving region, each light receiving unit is isolated from an adjacent light emitting sub-pixel through a light shielding wall or a light shielding pixel definition layer;

or, wherein the plurality of infrared light emission units are respectively arranged in a plurality of rows along the first direction, the plurality of visible light receiving units and infrared light receiving units are alternately arranged in a plurality of rows along the first direction, and the infrared light emission unit, the visible light receiving unit, and the infrared light receiving unit are alternately arranged in the second direction;

or, wherein the blue light sub-pixels comprise a first blue light sub-pixel and a third blue light sub-pixel, and an infrared light emission unit comprises a second blue light sub-pixel and an infrared light color conversion layer, and the infrared light color conversion layer is configured to convert blue visible photons emitted by the second blue light sub-pixel into near-infrared photons through near-infrared quantum tailoring; and the first blue light sub-pixel, the second blue light sub-pixel, and the third blue light sub-pixel are alternately disposed along the second direction, the second blue light sub-pixel is disposed between the first blue light sub-pixel and the third blue light sub-pixel, and the second blue light sub-pixel is located in a same pixel opening as the first blue light sub-pixel and the third blue light sub-pixel.

18. The display substrate according to claim 17, wherein on a plane perpendicular to the display substrate, the display substrate comprises the base substrate, a light device layer disposed on the base substrate, an encapsulation layer dispose on a side of the light device layer away from the base substrate, a light filter-and-color conversion layer dispose on a side of the encapsulation layer away from the light device layer, the light device layer comprises the light emitting sub-pixels, the visible light receiving units, and the infrared light receiving units, the light filter-and-color conversion layer comprises a blue light filter layer, an infrared light filter layer, and the infrared light color conversion layer, an orthographic projection of the blue light filter layer on the base substrate covers an orthographic projection of the visible light receiving unit on the base substrate, an orthographic projection of the infrared light filter layer on the base substrate covers an orthographic projection of the infrared light receiving unit on the base substrate, and an orthographic projection of the infrared light color conversion layer on the base substrate covers an orthographic projection of the second blue light sub-pixel on the base substrate; or wherein a distance between the first blue light sub-pixel and the second blue light sub-pixel along the second direction is equal to a distance between the second blue light sub-pixel and the third blue light sub-pixel along the second direction; or wherein a distance between the second blue light sub-pixel and the third blue light sub-pixel along the second direction is smaller than a distance between the third blue light sub-pixel and an infrared light receiving unit or a visible light receiving unit adjacent to the third blue light sub-pixel; or wherein a distance between the first blue light sub-pixel and the second blue light sub-pixel along the second direction is less than ½ of a distance between the third blue light sub-pixel and a red light sub-pixel adjacent to the third blue light sub-pixel along the first direction.

19. The display substrate according to claim 2, wherein the visible light emission unit is one or more light emitting sub-pixels, and the one or more light emitting sub-pixels are located in the effective display region.

20. A display apparatus, comprising the display substrate according to claim 1.

21. A visible light communication system, comprising at least one display apparatus according to claim 20 and an illumination system, wherein the illumination system comprises an emission light source, a preprocessing coding and modulation module, and a light receiver; the preprocessing coding and modulation module is configured to perform preprocessing coding and modulation on a network signal or a communication signal; the emission light source is configured to emit visible light for illumination, and emit a signal modulated by the preprocessing coding and modulation module in a form of a high-frequency signal with the visible light; the light receiver is configured to receive a light signal carrying communication information and convert the light signal into an electrical signal.

22. The visible light communication system according to claim 21, wherein the emission light source is a Light Emitting Diode (LED) emission light source; or the light receiver comprises at least one of: a visible light receiver and an infrared light receiver.

23. A visible light communication system, comprising at least two display apparatuses according to claim 20.

* * * * *